United States Patent
Fu

(10) Patent No.: US 7,187,100 B2
(45) Date of Patent: *Mar. 6, 2007

(54) DIMENSIONS FOR A MEMS SCANNING MIRROR WITH RIBS AND TAPERED COMB TEETH

(75) Inventor: Yee-Chung Fu, Fremont, CA (US)

(73) Assignee: Advanced NuMicro Systems, Inc., San Jose, CA (US)

( * ) Notice: Subject to any disclaimer, the term of this patent is extended or adjusted under 35 U.S.C. 154(b) by 108 days.

This patent is subject to a terminal disclaimer.

(21) Appl. No.: 10/828,946

(22) Filed: Apr. 20, 2004

(65) Prior Publication Data

US 2005/0231065 A1    Oct. 20, 2005

(51) Int. Cl.
*G02B 26/10* (2006.01)
*G02B 26/08* (2006.01)
*H02N 1/00* (2006.01)

(52) U.S. Cl. .................. 310/309; 359/224; 359/225; 359/291

(58) Field of Classification Search ............... 310/309; 359/223–226, 290, 291; 257/415
See application file for complete search history.

(56) References Cited

U.S. PATENT DOCUMENTS

| | | | |
|---|---|---|---|
| 5,202,785 A * | 4/1993 | Nelson | 359/214 |
| 6,347,002 B1 | 2/2002 | Hagelin et al. | 359/201 |
| 6,704,132 B2 * | 3/2004 | Dewa | 359/290 |
| 6,757,092 B2 * | 6/2004 | Abu-Ageel | 359/290 |
| 2001/0050801 A1 * | 12/2001 | Behin et al. | 359/298 |
| 2003/0019832 A1 * | 1/2003 | Conant et al. | 216/2 |
| 2003/0073261 A1 * | 4/2003 | Olav et al. | 438/67 |
| 2003/0156315 A1 * | 8/2003 | Li et al. | 359/290 |
| 2003/0203530 A1 | 10/2003 | Lee et al. | 438/72 |
| 2004/0099739 A1 * | 5/2004 | Kuo et al. | 235/454 |
| 2004/0100679 A1 * | 5/2004 | Kuo | 359/290 |
| 2005/0045727 A1 * | 3/2005 | Fu | 235/454 |
| 2005/0231065 A1 * | 10/2005 | Fu | 310/309 |

FOREIGN PATENT DOCUMENTS

| | | |
|---|---|---|
| EP | 1538476 | 6/2005 |
| JP | 2682181 | 10/1991 |
| JP | 2004-264702 | 3/2003 |
| JP | 2004-294959 | 3/2003 |
| JP | 2003-172897 | 6/2003 |
| JP | 2004-37886 | 2/2004 |
| WO | WO 02/059942 A | 8/2002 |

OTHER PUBLICATIONS

Great Britain Search Report, 3 pages, Aug. 2005.
French Search Report, 3 pages, Jan. 2006.

* cited by examiner

*Primary Examiner*—Karl Tamai
(74) *Attorney, Agent, or Firm*—Patent Law Group LLP; David C. Hsia

(57) ABSTRACT

A micro-electro-mechanical system (MEMS) mirror device includes an mirror, bonding pads, springs, and beams connected to the mirror. The mirror has a width greater than 1000 and less than 1200 microns, a length greater than 4000 and less than 5500 microns, and a thickness greater than 240 microns. Each beam includes a plurality of rotational comb teeth and is connected by multiple springs to the bonding pads.

43 Claims, 20 Drawing Sheets

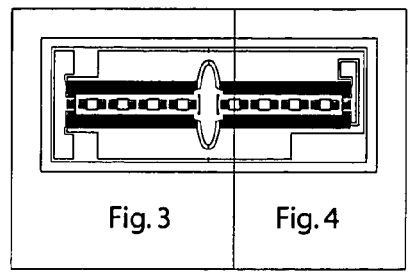
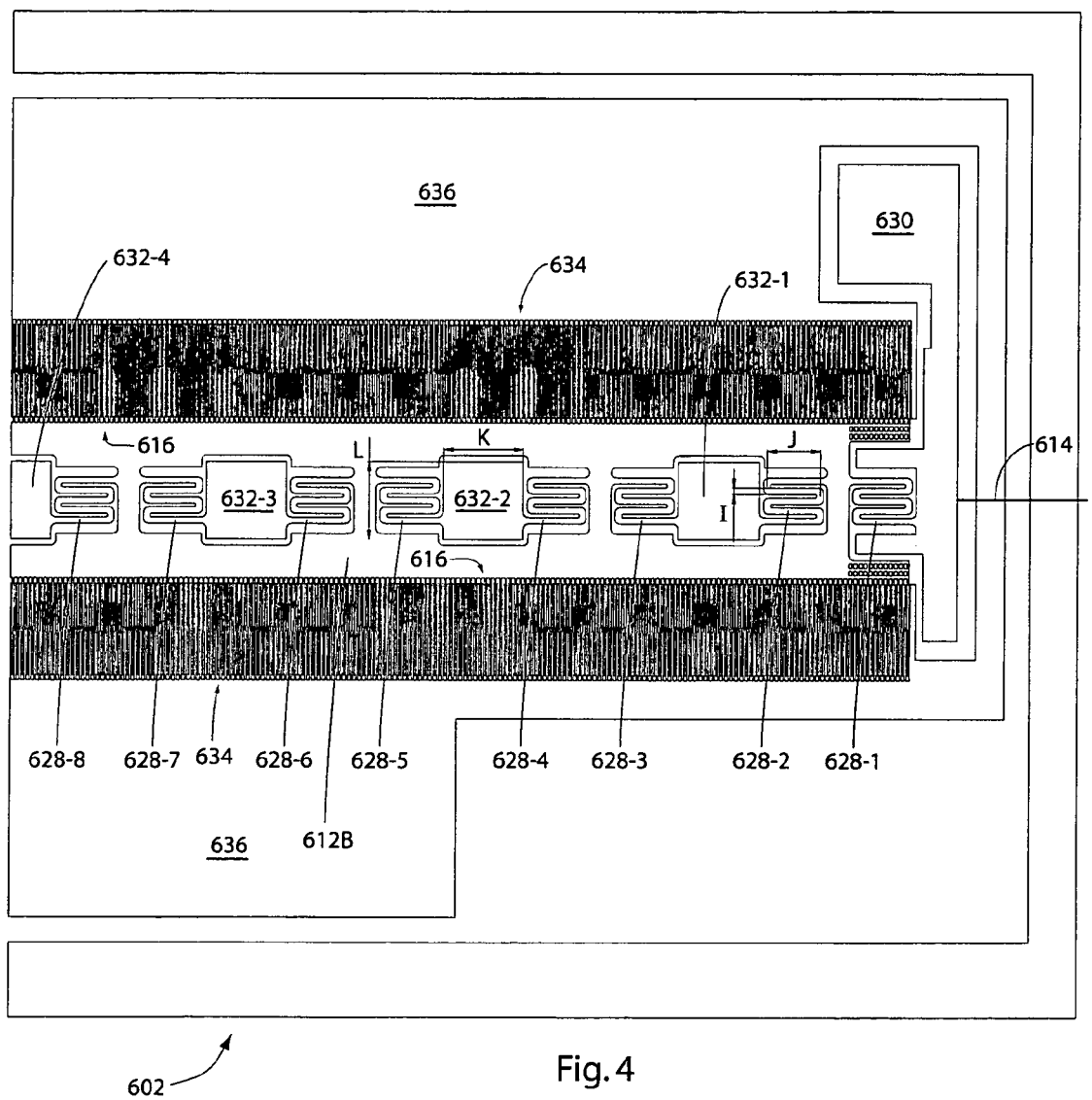
Fig. 4

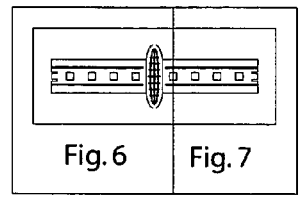
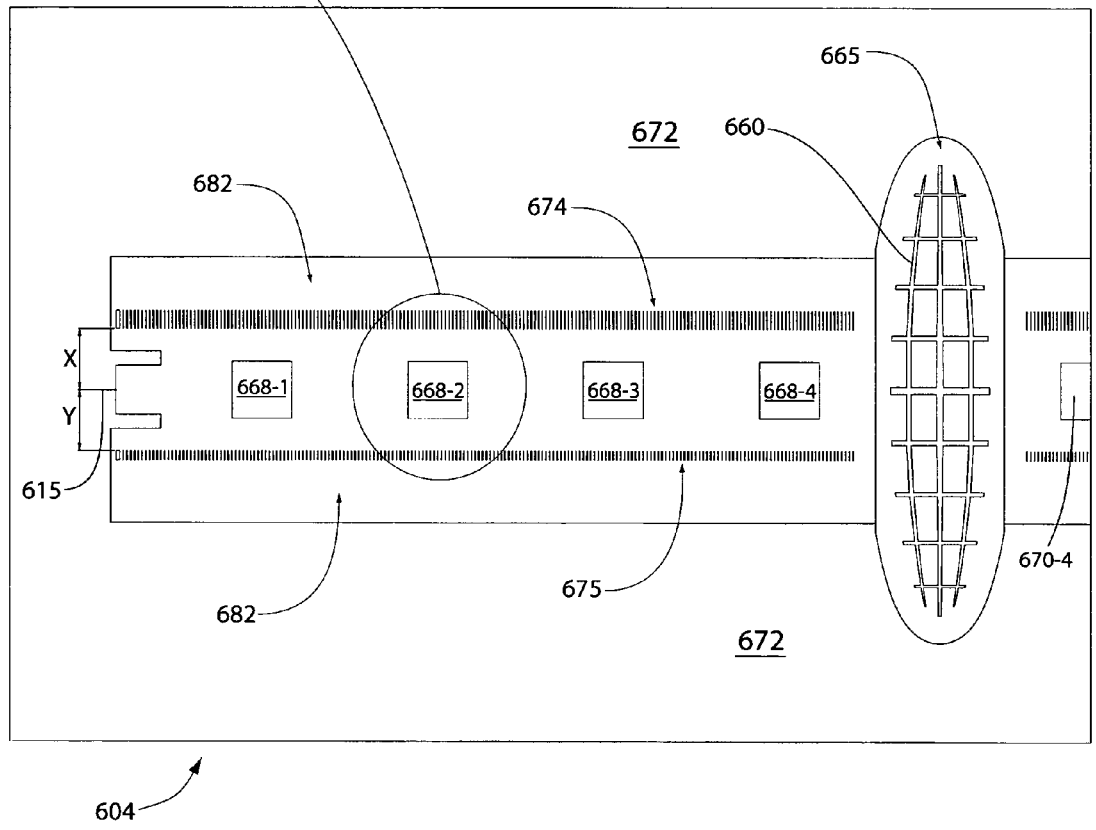
Fig. 6

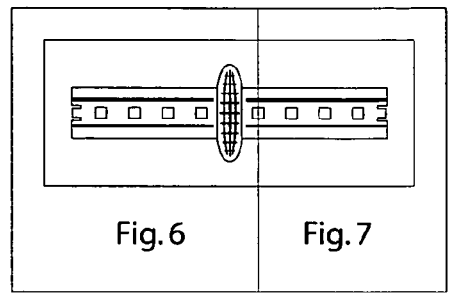
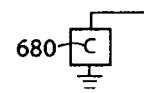
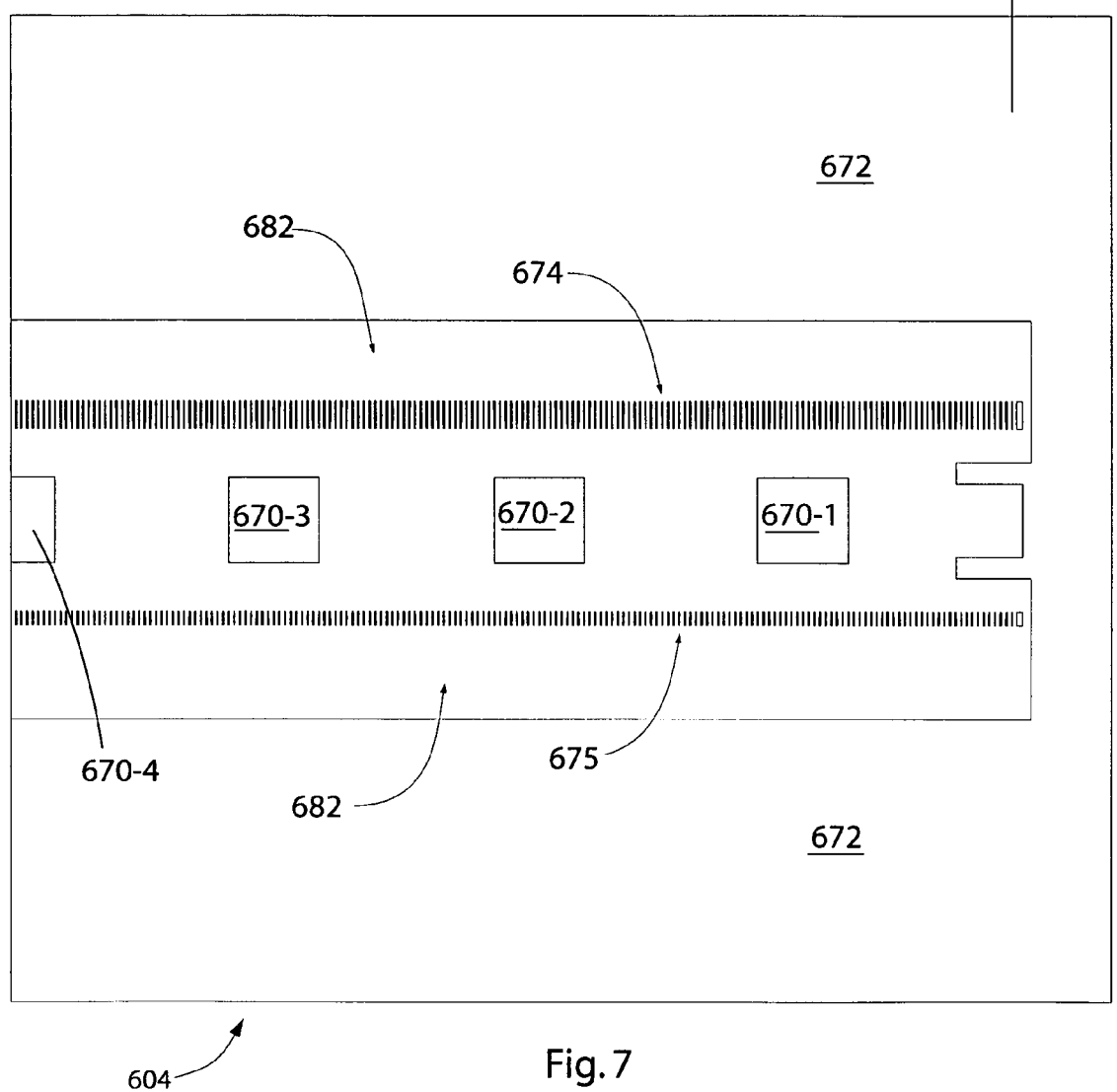
Fig. 7

DIMENSIONS FOR A MEMS SCANNING MIRROR WITH RIBS AND TAPERED COMB TEETH

FIELD OF INVENTION

This invention relates to micro-electro-mechanical system (MEMS) devices, and more particularly to MEMS scanning mirrors.

DESCRIPTION OF RELATED ART

Various electrostatic comb actuator designs for MEMS scanning mirrors have been proposed. The extensive applications of these devices include barcode readers, laser printers, confocal microscopes, projection displays, rear projection TVs, and wearable displays. Typically a MEMS scanning mirror is driven at its main resonance to achieve a large scan angle. To ensure a stable operation, it is crucial to ensure the mirror and its associated movable structure will vibrate in the desired mode shape at the lowest and main resonant frequency. In many applications, the mirror size has to be large and the mirror surface has to be flat to ensure high optical resolution. The mirror vibration/scanning speed also has to be fast for many applications. It is known that when the mirror size and scanning speed increase, the mirror dynamic flatness deteriorates. Without a flat mirror surface, the scanning mirror is of little use to many applications. In addition, this main frequency has to be separated far from other structural vibration frequencies to avoid potential coupling between the desired and the undesired mode shapes.

The undesired structural vibrations will increase the mirror dynamic deformation and result in degraded optical resolution. Furthermore, some of the structural vibration modes may cause the rotationally movable and stationary comb teeth to come into contact and break the actuator all together. Two or more structural vibration modes with close resonant frequencies may be coupled to produce high vibration amplitude that leads to hinge failure. Thus, an apparatus and a method are needed in the design of MEMS scanning mirrors to effectively improve the vibration stability at resonance, and to ensure optical resolution of these devices.

SUMMARY

In one embodiment of the invention, a micro-electromechanical system (MEMS) mirror device includes a mirror, bonding pads, springs, and beams connected to the mirror. The mirror has a width greater than 1000 and less than 1200 microns, a length greater than 4000 and less than 5500 microns, and a thickness greater than 240 microns. Each beam includes a plurality of rotational comb teeth and is connected by multiple springs to the bonding pads.

BRIEF DESCRIPTION OF THE DRAWINGS

FIGS. 3, 4, 5, 6, 7, and 8 illustrate a MEMS device in another embodiment of the invention.

Use of the same reference numbers in different figures indicates similar or identical elements.

DETAILED DESCRIPTION OF THE INVENTION

Figure 1A:
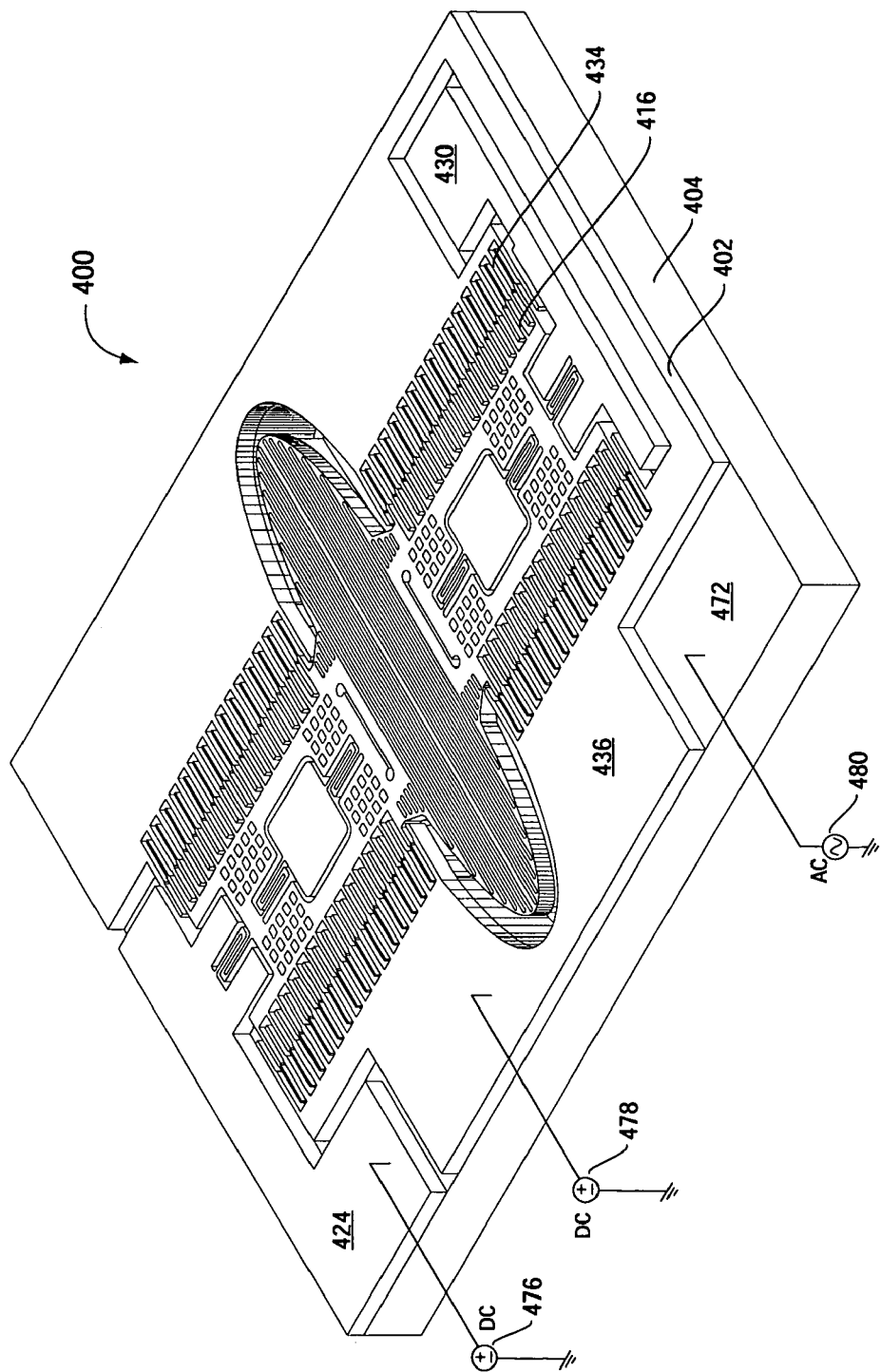
FIGS. 1A, 1B, 1C, 1D, 1E, 1F, and 1G illustrate a MEMS device in one embodiment of the invention.

FIG. 1A illustrates a MEMS scanning mirror device 400 in one embodiment of the invention. Device 400 includes a top layer 402 bonded atop but electrically insulated from a bottom layer 404.

Figure 1B:
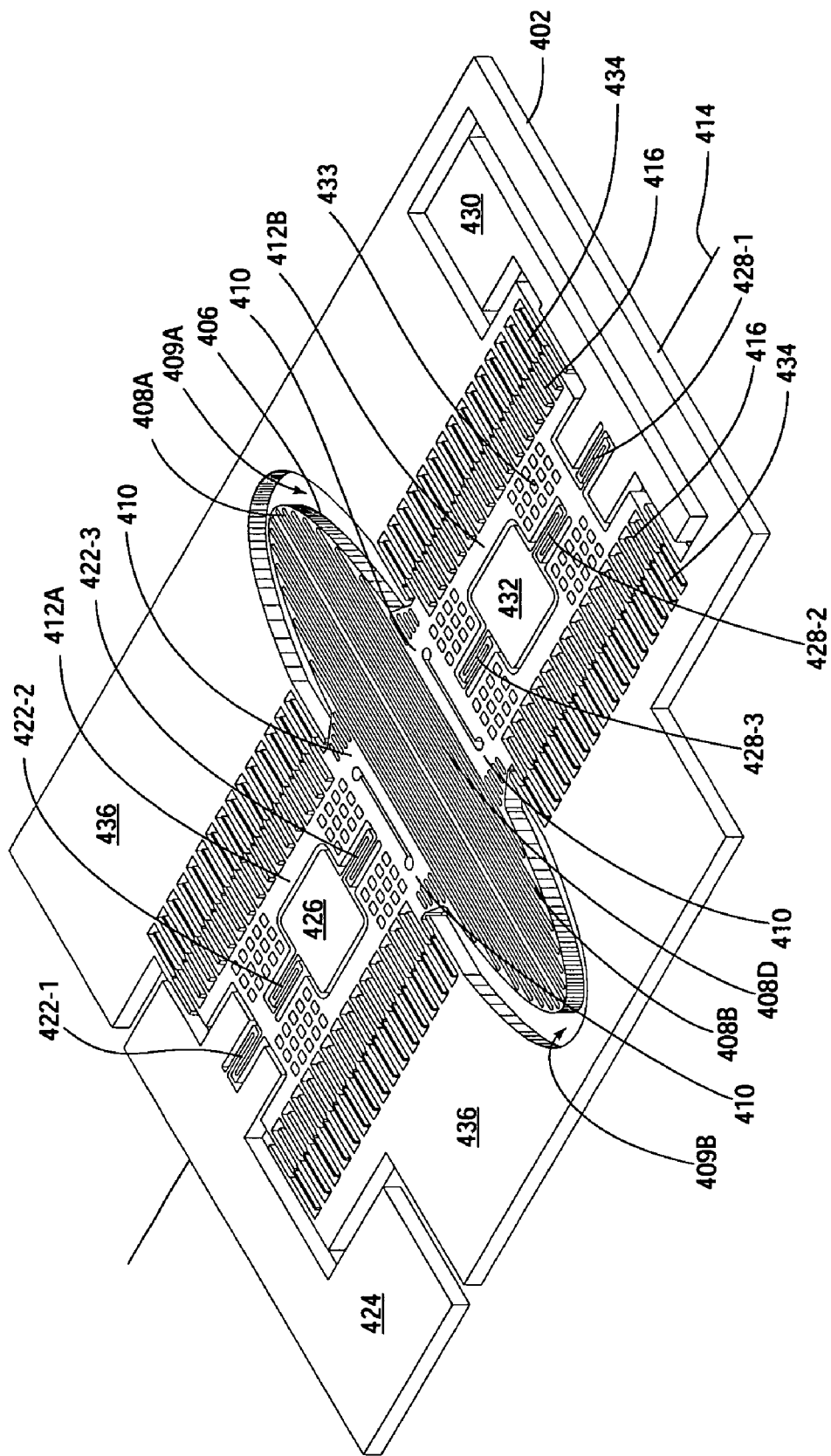
Figure 1C:
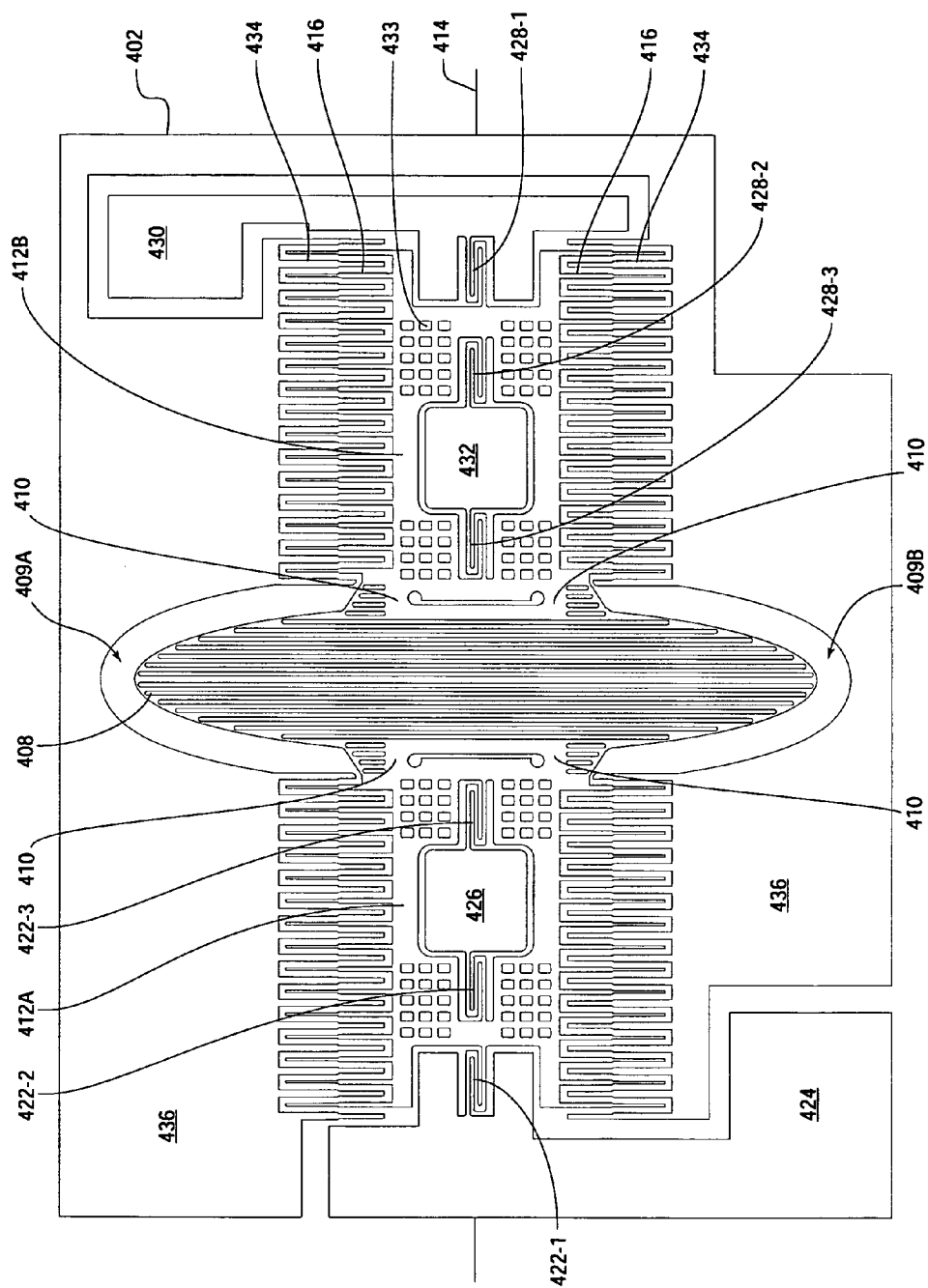
Figure 1D:
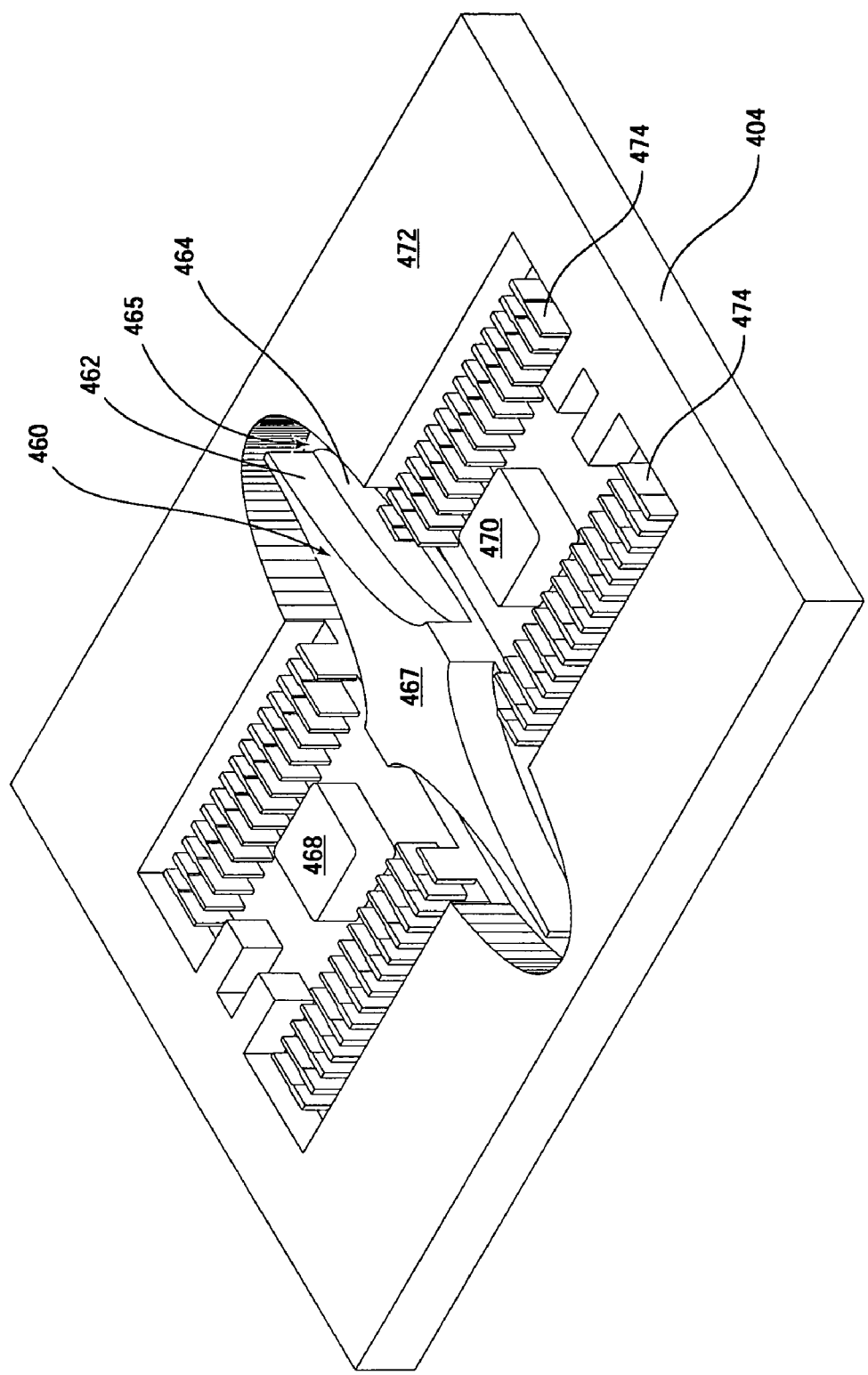

FIGS. 1B and 1C illustrate the details of top layer 402. Top layer 402 includes a top mirror layer 406 having an oval shape. Top mirror layer 406 includes trenches/grooves 408 on its top surface. Trenches 408 reduce the mass of top mirror layer 406, which in turn minimizes the total dynamic deformation. By minimizing the total dynamic deformation, the optical resolution of device 400 is improved. Although shown to run along the entire top surface, trenches 408 may be most effective when placed along the outer perimeter of top mirror layer 406 away from a rotational axis 414. As described later, trenches 408 can be etched at the same time as other components by controlling their width so they are not etched through top mirror layer 406. Alternatively, a shadow mask can be used to protect top mirror layer 406 during etching to prevent trenches 408 from etching through. The positions and the number of trenches 408 can be refined through finite element analysis. Gaps 409A and 409B separate top mirror layer 406 from the surrounding components in top layer 402. As described later, the width of gaps 409A and 409B is designed to be greater than the widths of the gaps around more fragile components so that any trapped gas can escape around top mirror layer 406 instead of the fragile components during the etching process.

Opposing sides of top mirror layer 406 are connected by multiple support attachments 410 to the proximate ends of beam-like structures 412A and 412B. By connecting top mirror layer 406 at multiple locations to beams 412A and 412B, the dynamic deformation of top mirror layer 406 is minimized. The positions and the number of support attachments 410 can be refined through finite element analysis.

Opposing sides of beams 412A and 412B about a rotational axis 414 are connected to rotational comb teeth 416. Rotational comb teeth 416 each has a tapered body that consists of an end rectangular section that has a smaller cross-section than a base rectangular section. By reducing the size and thus the weight of rotational comb teeth 416 at its ends, the inertia of the entire structure is reduced. By reducing the structural inertia, the scanning speed can be increased or/and the driving voltage can be reduced. In one embodiment, rotational comb teeth 416 provide the electrostatic biasing force used to increase the driving efficiency of the movable structure by tuning its modal frequency. In another embodiment, rotational comb teeth 416 provide the electrostatic driving force to drive the mirror. In yet another embodiment, rotational comb teeth 416 provide both the electrostatic biasing force and the electrostatic driving force.

Beams 412A and 412B are connected by serpentine springs to bonding pads mounted atop bottom layer 404. Specifically, beam 412A has a distal end connected by a serpentine spring 422-1 to a bonding pad 424, and a midsection connected by serpentine springs 422-2 and 422-3 to a bonding pad 426 formed within beam 412A. Similarly, beam 412B has a distal end connected by a serpentine spring 428-1 to a bonding pad 430, and a midsection connected by serpentine springs 428-2 and 428-3 to a bonding pad 432 formed within beam 412B. Thus, beams 412A and 412B are connected by springs in a distributed manner along rotational axis 414 of top mirror layer 406. Beams 412A and 412B may include holes 433 to reduce their mass.

By carefully adjusting the distribution of the stiffness and the location of the springs, all modal frequencies of the movable structure can be effectively separated and the desired rotational mode can be designed at the lowest resonance frequency. Since the main resonant frequency is the lowest and far apart from other structural modal frequencies, the mirror rotation will not excite any other undesired vibration mode. By using multiple springs, the maximum stress and strain on each spring are lower than conventional scanning mirror designs supported by only a pair of torsional beams. Since the stress and strain on each spring are reduced, the reliability of each spring is improved and the rotational angle is increased.

Top layer 402 may include stationary comb teeth 434 that are interdigitated in-plane with rotational comb teeth 416. Stationary comb teeth 434 may have a tapered body like rotational comb teeth 416. In one embodiment, stationary comb teeth 434 provide the electrostatic biasing force used to increase the driving efficiency of the movable structure by tuning its modal frequency. In another embodiment, stationary comb teeth 434 provide the electrostatic driving tree to drive top mirror layer 406. In yet another embodiment, stationary comb teeth 434 provide both the electrostatic biasing force and the electrostatic driving force. Stationary comb teeth 434 are connected to bonding pad 436 mounted atop bottom layer 404.

Figure 1E:
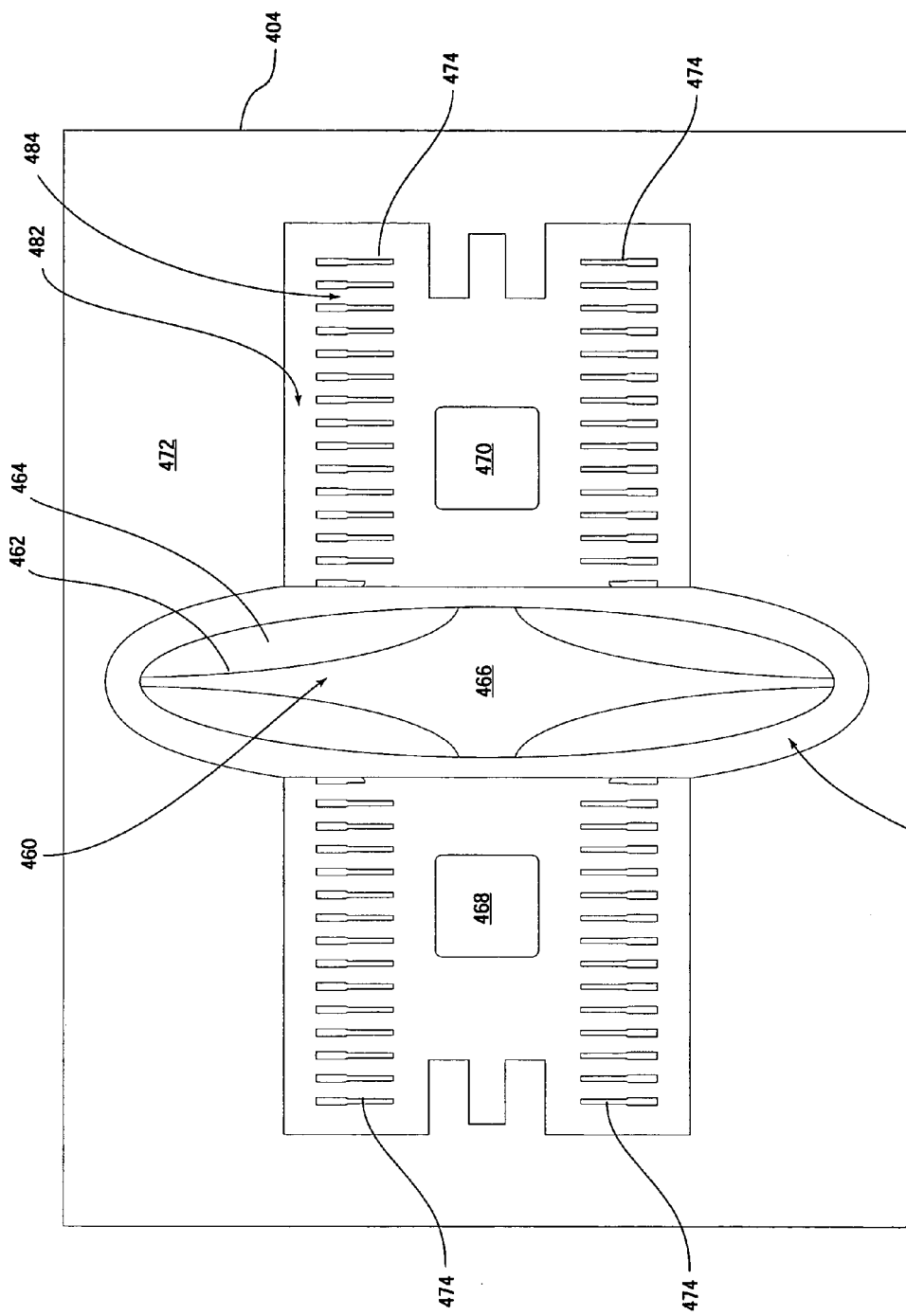
Figure 1F:
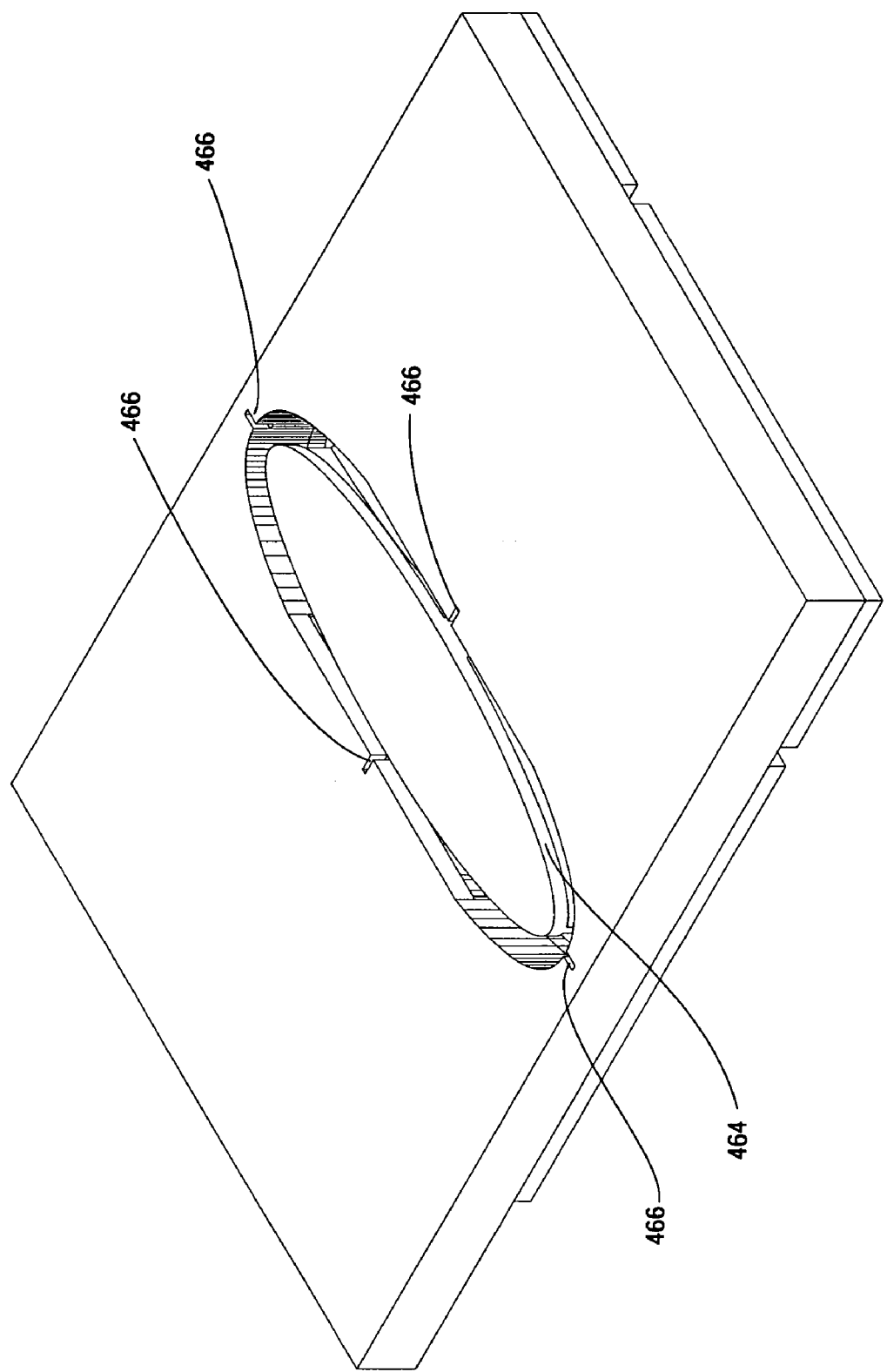
Figure 1G:
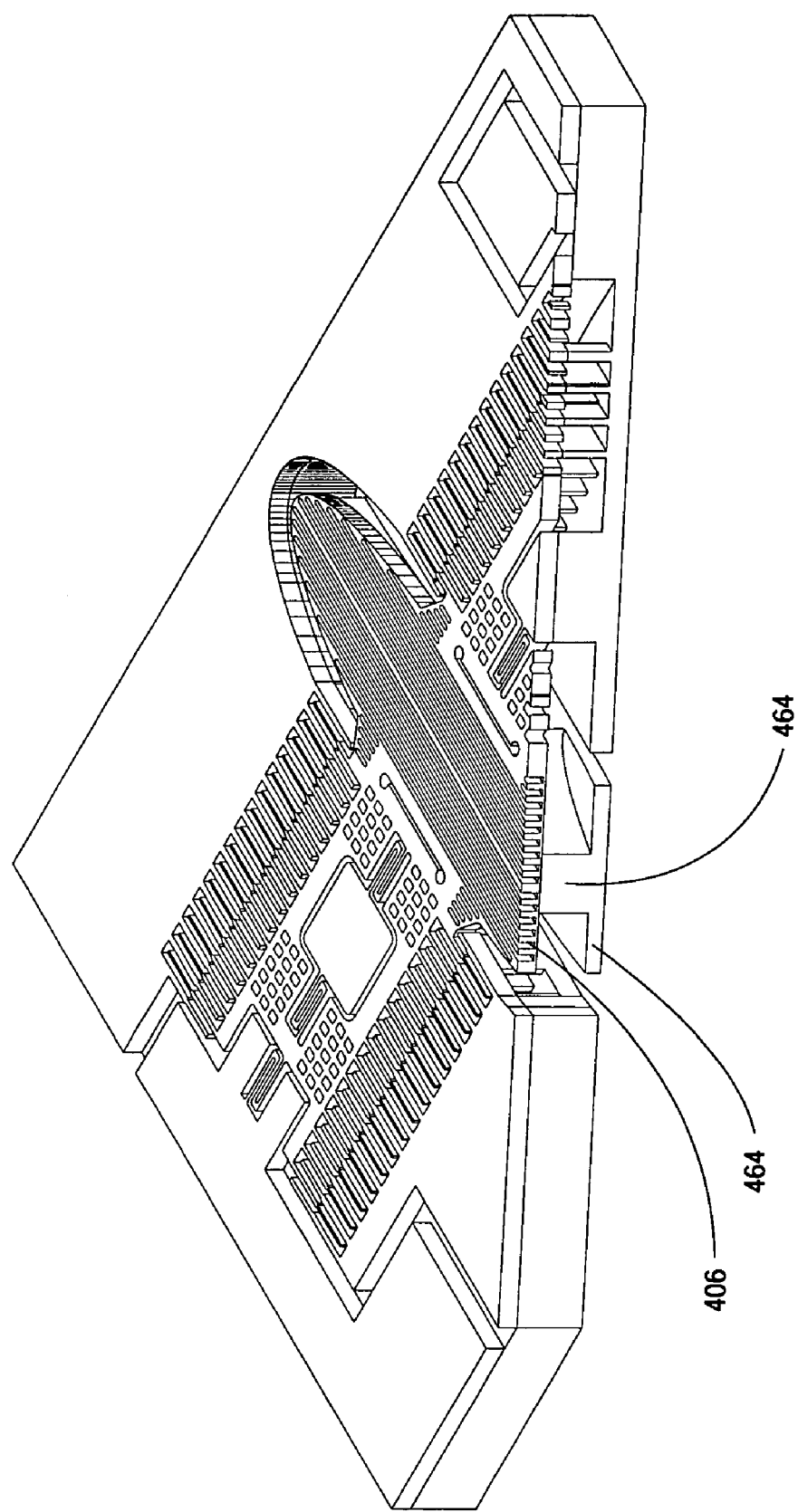

FIGS. 1D, 1E, 1F, and 1G illustrate the details of bottom layer 404. Bottom layer 404 includes a bottom mirror layer 460 having a protrusion 462 from an oval plate 464. A gap 465 separates bottom mirror layer 460 from the surrounding components in bottom layer 404. As shown in FIG. 1F, the bottom surface of plate 464 serves as the reflecting surface and other structures can be aligned with the mirror using assembly alignment marks 466 on the bottom surface of bottom layer 404. The top surface 467 of bottom mirror layer 460 is bonded with the bottom surface of top mirror layer 406 to form the final mirror. As shown in FIG. 1G, the final mirror has an I-beam like structure where top mirror layer 406 forms the top flange, protrusion 462 forms the web, and plate 464 forms the bottom flange. The I-beam like structure removes most of the mirror mass and stiffens the mirror structure. Therefore, it minimizes the dynamic deformation of the bottom mirror surface. By minimizing the total dynamic deformation of bottom mirror surface, the optical resolution of device 400 is improved. The shape of the I-beam like structure can be refined through finite element analysis.

Bottom layer 404 includes surfaces for anchoring the bonding pads of the movable structure in top layer 402. Specifically, anchoring pads 468 and 470 provide surfaces for mounting corresponding bonding pads 426 and 432, and anchoring pad 472 provides a surface for mounting bonding pads 424, 430, and 436.

Bottom layer 404 includes stationary comb teeth 474 that are out-of-plane interdigitated with rotational comb teeth 416. In other words, they are interdigitated when viewed from above or when the final mirror is rotated. Stationary comb teeth 474 may have a tapered body like comb teeth 416 and 434. Referring to FIG. 1E, a gap 482 is provided between stationary comb teeth 474 and anchoring pad 472. Gap 482 has a width greater than gaps 484 between adjacent stationary comb teeth 474 so that gap 482 is etched deeper into bottom layer 404 than gaps 484. A deeper gap 482 allows rotational comb teeth 416 to rotate at a greater angle without contacting bottom layer 404. In one embodiment, stationary comb teeth 474 provide the electrostatic driving force to drive the final mirror. In another embodiment, stationary comb teeth 474 provide the electrostatic biasing force used to increase the driving efficiency of the movable structure. In another embodiment, stationary comb teeth 474 provide both the electrostatic driving force and the electrostatic biasing force. In yet another embodiment, the capacitance between rotational comb teeth 416 and stationary comb teeth 474 is sensed to determine the rotational position of the mirror.

Figure 2:
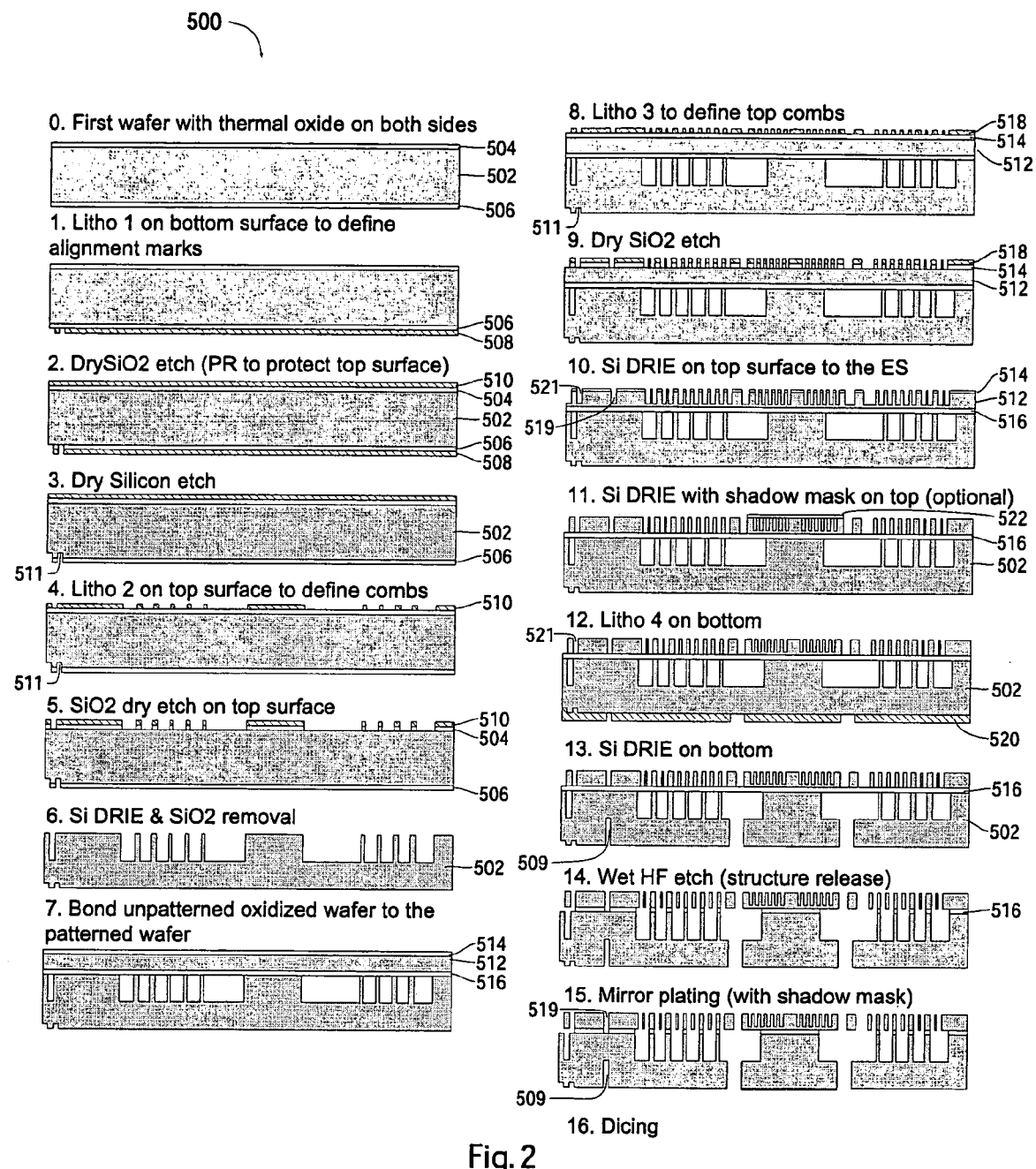
FIG. 2 illustrates process for manufacturing the device of FIG. 1A in one embodiment of the invention.

FIG. 2 illustrates a method 500 for making device 400 in one embodiment of the invention. The process starts at a step 0 with a silicon wafer 502 having a silicon dioxide layer 504 formed on the top surface and a silicon dioxide layer 506 formed on the bottom surface. Wafer 502 is used to form bottom layer 404 (FIG. 1E) of device 400.

In step 1, a photoresist 508 is deposited on oxide layer 506, exposed, and developed in a lithographic process to define one or more lithographic alignment marks 511 (shown in step 3).

In step 2, the bottom surface of wafer 502 is etched to remove portions of oxide layer 506 left unprotected by photoresist 508. In one embodiment, oxide layer 506 is dry etched. The top surface of wafer 502 is deposited with a photoresist 510 to protect it from the etching of the bottom surface.

In step 3, the bottom wafer surface of wafer 502 is etched to remove portions of wafer 502 left unprotected by oxide layer 506 to form lithography alignment marks 511. After the silicon dry etch, the remaining photoresists 508 and 510 are stripped.

In step 4, photoresist 510 is reapplied and is exposed and developed in a lithographic process to define bottom mirror layer 460 (FIG. 1E), surfaces 468, 470, and 472 (FIG. 1E), and stationary comb teeth 474 (FIG. 1E) on the top surface of wafer 502. The mask used is aligned with the lithographic alignment marks 511 on the bottom wafer surface.

In step 5, the top surface of wafer 502 is etched to remove portions of oxide layer 504 left unprotected by photoresist 510. In one embodiment, oxide layer 504 is dry etched.

In step 6, the top surface of wafer 502 is etched to remove portions of wafer 502 left unprotected by oxide layer 504 to form bottom mirror layer 460 (FIG. 1E), surfaces 468, 470, and 472, and stationary comb teeth 474 (FIG. 1E). Afterwards, the remaining photoresist 510 is stripped and oxide layers 504 and 506 are removed by a wet or dry etch.

In step 7, a silicon wafer 512 is bonded to the top surface of wafer 502. Wafer 512 has a silicon dioxide layer 514 formed on the top wafer surface and a silicon dioxide layer 516 formed on the bottom wafer surface. Wafer 512 is used to form top layer 402 (FIG. 1C) of device 400. In one embodiment, wafers 512 and 502 are bonded by silicon fusion.

In step 8, a photoresist 518 is deposited on oxide layer 514, exposed, and developed in a lithographic process to define the components of top layer 402 (FIG. 1C). The mask used is aligned with lithographic alignment marks 511 on the bottom wafer surface. Also defined in step 8 are one or more lithographic alignment marks 521 (shown in step 10) and a separation trench 519 (shown in step 10). In order to etch trenches 408 (FIG. 1C), which are etched into wafer 512 at a particular depth, along with the gaps that surround the other components, which are etched through wafer 512, the dimensions of trenches 408 and the gaps of the other components are differentiated.

In step 9, the top surface of wafer 512 is etched to remove portions of oxide layer 514 left unprotected by photoresist 518. In one embodiment, oxide layer 514 is dry etched. Afterwards, the remaining photoresist 518 is stripped.

In step 10, the top surface of wafer 512 is etched to remove portions of wafer 512 left unprotected by oxide layer 514 to form the components of top layer 402 (FIG. 1C). In one embodiment, wafer 512 is etched using a DRIE process down to the etch stop formed by oxide layer 516. When the top of device 400 is etched through, gas trapped between the bonded wafers 502 and 512 may escape and damage fragile components such as the comb teeth. To prevent such damage, gaps 409A and 409B (FIG. 1C) around top mirror layer 406 (FIG. 1C) are designed to be larger than the gaps around the other components so that oxide layer 516 beneath gaps 409A and 409B are etched through before the other gaps. This allows the air to escape around top mirror layer 406, which is a structurally strong component.

In step 11, the top surface of the mirror is protected by a shadow mask surface 522 to prevent the top mirror layer 406 from being etched through. This step is optional if inertia-reducing trenches 408 have a width that is smaller than other gaps so they are not etched through. However, the shadow mask may be preferred to create inertia-reducing trenches 408 having greater width, thereby removing more mass and further reducing the inertia of the rotating structure.

In step 12, a photoresist 520 is deposited on the bottom surface of wafer 502, exposed, and developed on the bottom surface of wafer 502 to define assembly alignment marks 466 (FIG. 1F), separation trench 509 (shown in step 13), and gap 465 (FIG. 1E) for separating bottom mirror layer 460 (FIG. 1E) from bottom layer 404 (FIG. 1E). The mask used is aligned with lithographic alignment marks 521 on the top wafer surface.

In step 13, the bottom surface of wafer 502 is etched to remove portions of wafer 502 left unprotected by photoresist 520 to form assembly alignment marks 466 (FIG. 1F) and separation trench 509, and to separate bottom mirror layer 460 (FIG. 1E) from layer 404 (FIG. 1E). In one embodiment, wafer 502 is etched using a DRIE process.

In step 14, portions of oxide layer 516 are removed from the structure to release the various components of device 400 while maintaining the bonds between the corresponding bonding and anchoring pads. In one embodiment, portions of oxide layer 516 are removed using a hydrofluoric acid wet etch.

In step 15, the bottom surface of bottom mirror layer 460 (FIG. 1F) is deposited with a reflective material (e.g., aluminum) to create a mirror surface. In one embodiment, a shadow mask is used to define areas to be deposited with the reflective material.

In step 16, devices 400 made from wafers 502 and 512 are singulated. In one embodiment, wafers 502 and 512 are singulated by dicing through separation trenches 509 and 519 (shown in step 15).

Referring to FIG. 1A, the operation of device 400 in one embodiment is explained hereafter. Rotational comb teeth 416 are coupled via bonding pad 424 to receive a reference voltage from a voltage source 476 (e.g., ground). Stationary comb teeth 434 are coupled via bonding pad 436 to receive a steady voltage from a voltage source 478 (e.g., a DC voltage source). Stationary comb teeth 474 (FIGS. 1D and 1E) are coupled via bonding pad 472 to receive an oscillating voltage from a voltage source 480 (e.g., an AC voltage source). Thus, a steady voltage difference between rotational comb teeth 416 and stationary comb teeth 434 changes the natural frequency of device 400, whereas an AC voltage difference between rotational comb teeth 416 and stationary comb teeth 474 (FIGS. 1D and 1E) oscillates the mirror at the desired scanning frequency and at the desired scanning angle.

Figure 1H:
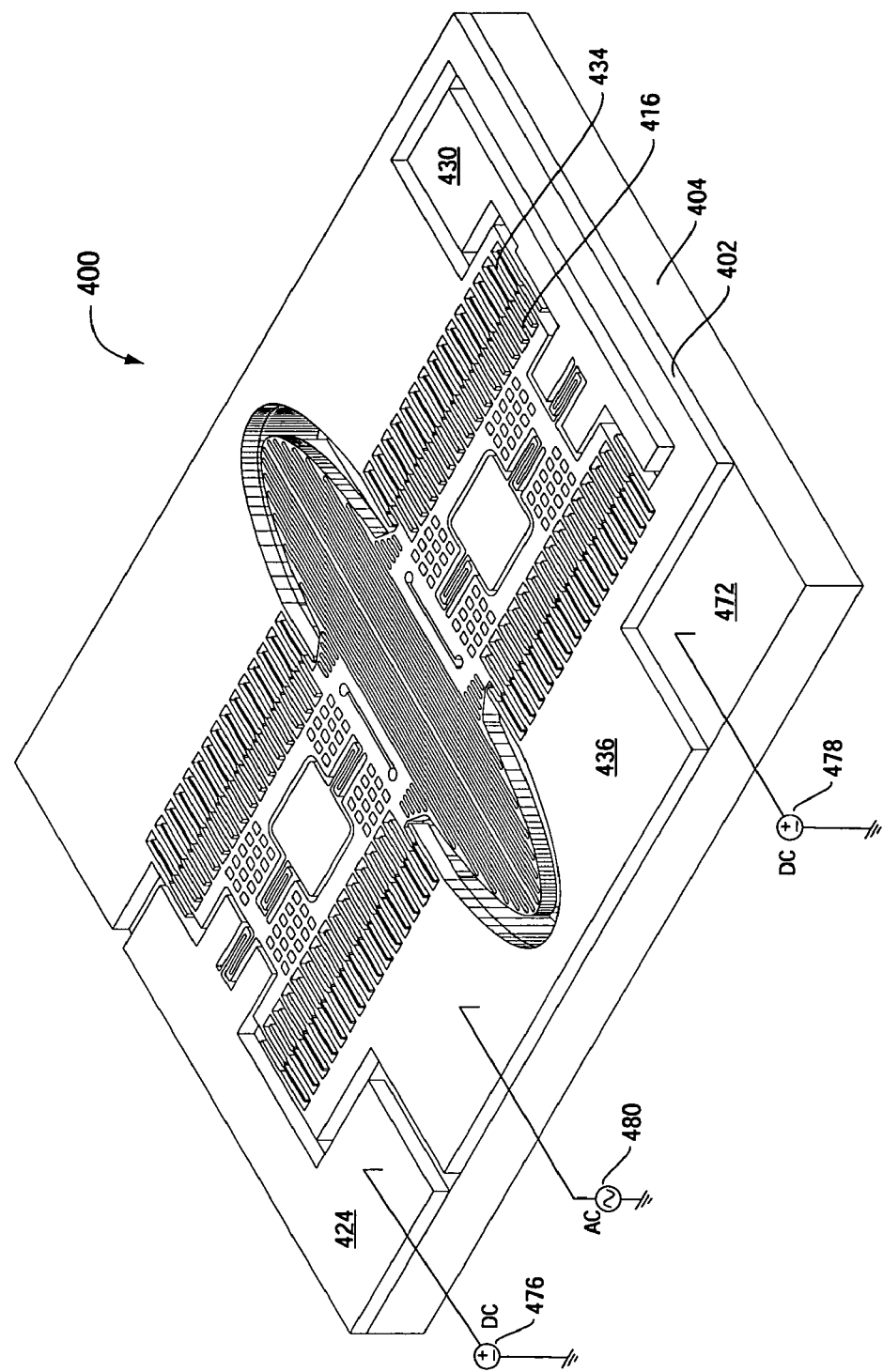
FIGS. 1H, 1I, 1J, and 1K illustrate the MEMS device of FIG. 1A with different power schemes in embodiments of the invention.

Referring to FIG. 1H, the operation of device 400 in another embodiment is explained hereafter. Rotational comb teeth 416 are coupled via bonding pad 424 to receive a steady voltage from voltage source 476 (e.g., a DC voltage source). Stationary comb teeth 434 are coupled via bonding pad 436 to receive an oscillating voltage from AC voltage source 480. Stationary comb teeth 474 (FIGS. 1D and 1E) are coupled via bonding pad 472 to receive a steady voltage from DC voltage source 478. Between rotational comb teeth 416 and stationary comb teeth 434, a steady voltage difference changes the natural frequency and the rotation amplitude of device 400 while an AC voltage oscillates the mirror at the desired scanning frequency and at the desired scanning angle. Furthermore, a steady voltage difference between rotational comb teeth 416 and stationary comb teeth 474 (FIGS. 1D and 1E) can also be used to change the amplitude of the rotational angle of device 400. The capacitance between rotational comb teeth 416 and stationary comb teeth 474 can also be sensed through respective bonding pads 436 and 472 to determine the rotational angle of device 400.

Figure 1I:
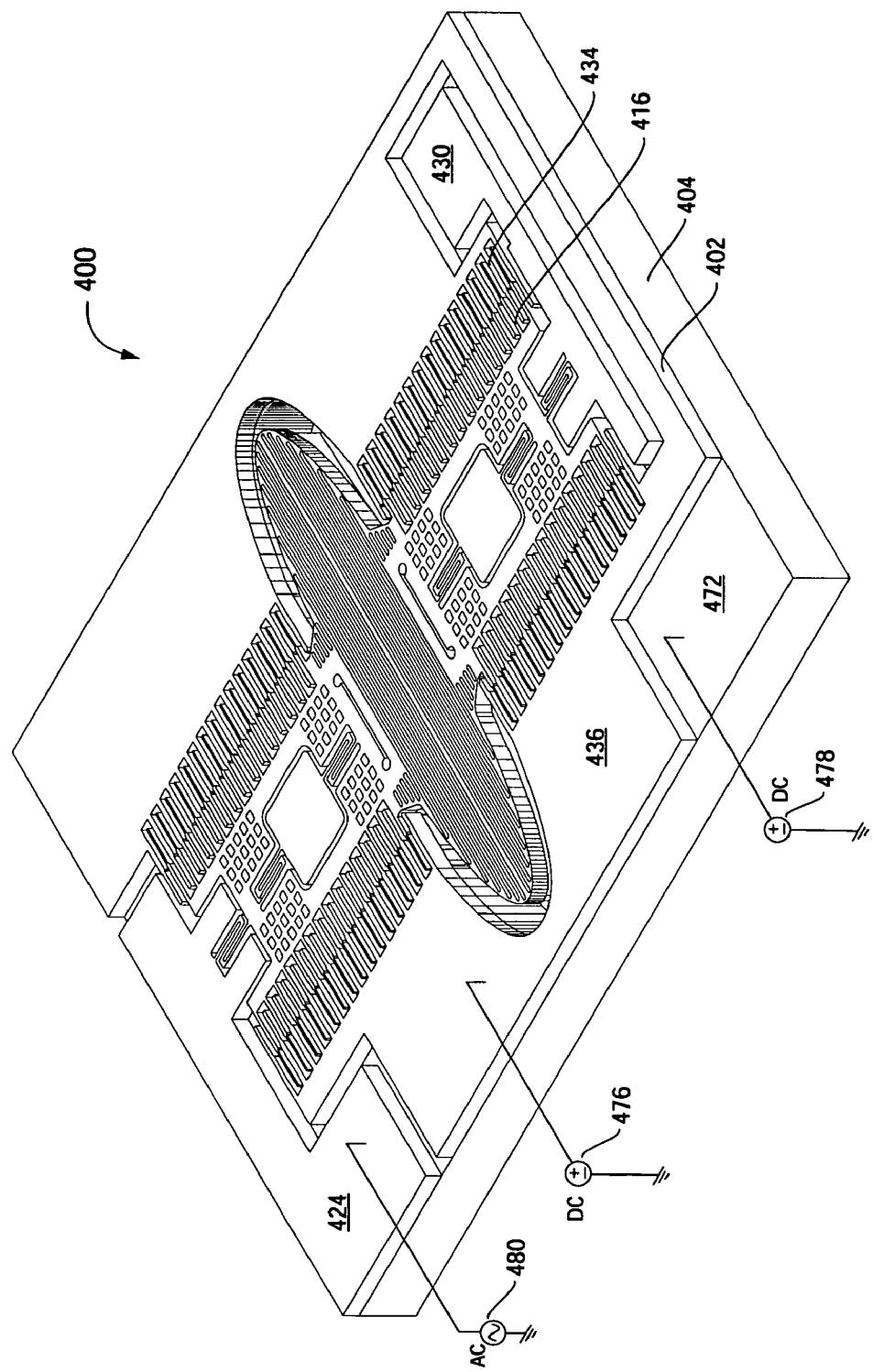

Referring to FIG. 1I, the operation of device 400 in another embodiment is explained hereafter. Rotational comb teeth 416 are coupled via bonding pad 424 to receive an oscillating voltage from AC voltage source 480. Stationary comb teeth 434 are coupled via bonding pad 436 to receive a steady voltage from DC voltage source 476. Stationary comb teeth 474 (FIGS. 1D and 1E) are coupled via bonding pad 472 to receive a steady voltage from DC voltage source 478. Between rotational comb teeth 416 and stationary comb teeth 434, a steady voltage difference changes the natural frequency and the rotation amplitude of device 400 while an AC voltage difference between rotational comb teeth 416 and stationary comb teeth 434 oscillates the mirror at the desired scanning frequency and at the desired scanning angle. A steady voltage difference between rotational comb teeth 416 and stationary comb teeth 474 (FIGS. 1D and 1E) can also be used to change the amplitude of the rotational angle of device 400. The capacitance between rotational comb teeth 416 and stationary comb teeth 474 can also be sensed through respective bonding pads 436 and 472 to determine the rotational angle of device 400.

Figure 1J:
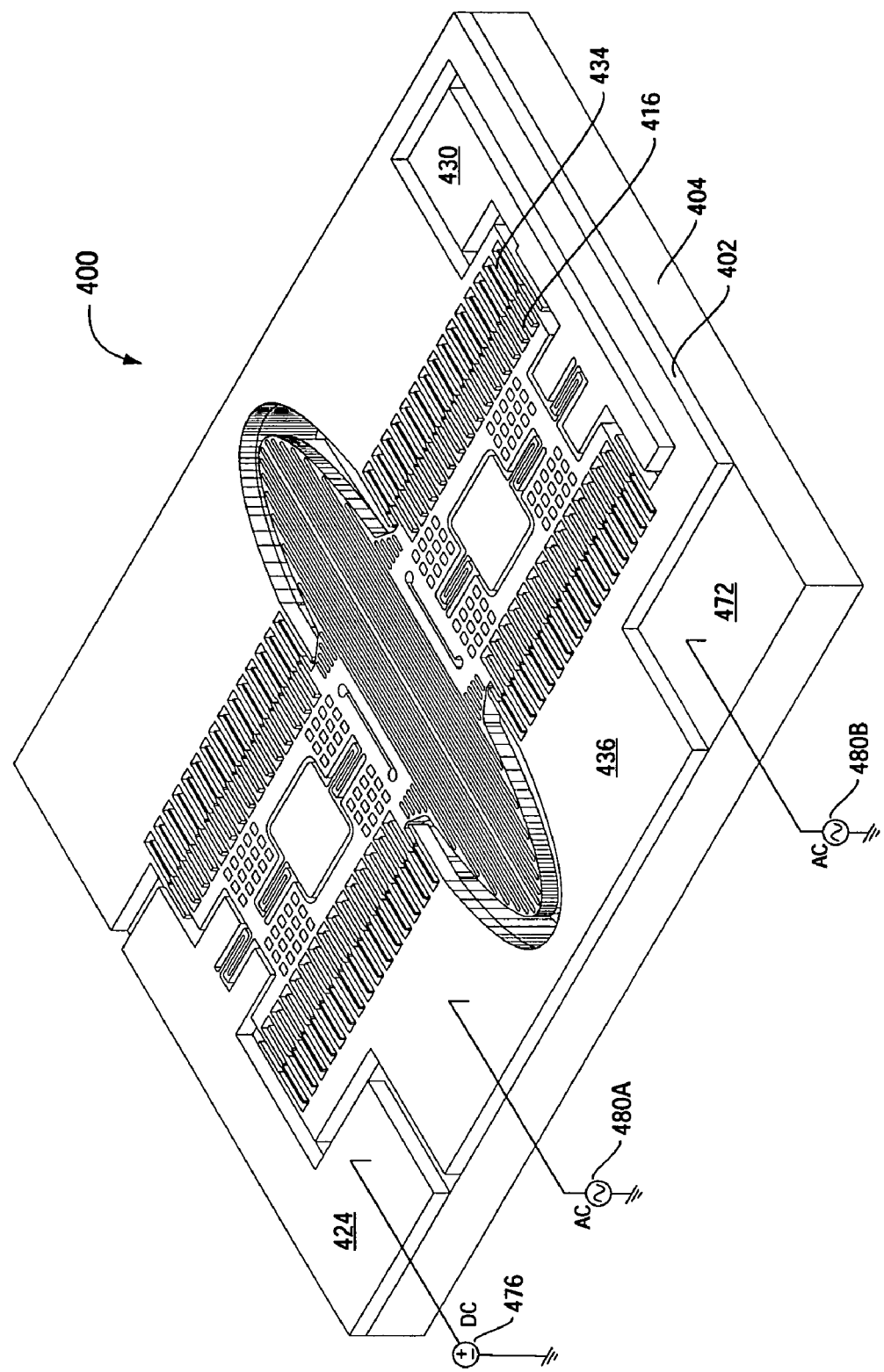

Referring to FIG. 1J, the operation of device 400 in another embodiment is explained hereafter. Rotational comb teeth 416 are coupled via bonding pad 424 to receive a steady voltage from DC voltage source 476. Stationary comb teeth 434 are coupled via bonding pad 436 to receive an oscillating voltage from an AC voltage source 480A. Stationary comb teeth 474 (FIGS. 1D and 1E) are coupled via bonding pad 472 to receive an oscillating voltage from an AC voltage source 480B. The oscillating voltage provided by AC voltage source 480B is out of phase (e.g., 180 degrees out of phase) with the oscillating voltage provided by voltage source 480A. Between rotational comb teeth 416 and stationary comb teeth 434, a steady voltage difference changes the natural frequency and the rotation amplitude of device 400 while an AC voltage difference oscillates the mirror at the desired scanning frequency and at the desired scanning angle. An AC voltage difference between rotational comb teeth 416 and stationary comb teeth 474 (FIGS. 1D and 1E) can also be used to oscillate the mirror at the desired scanning frequency and at the desired scanning angle. The capacitance between rotational comb teeth 416 and stationary comb teeth 474 can also be sensed through respective bonding pads 436 and 472 to determine the rotational angle of device 400.

Figure 1K:
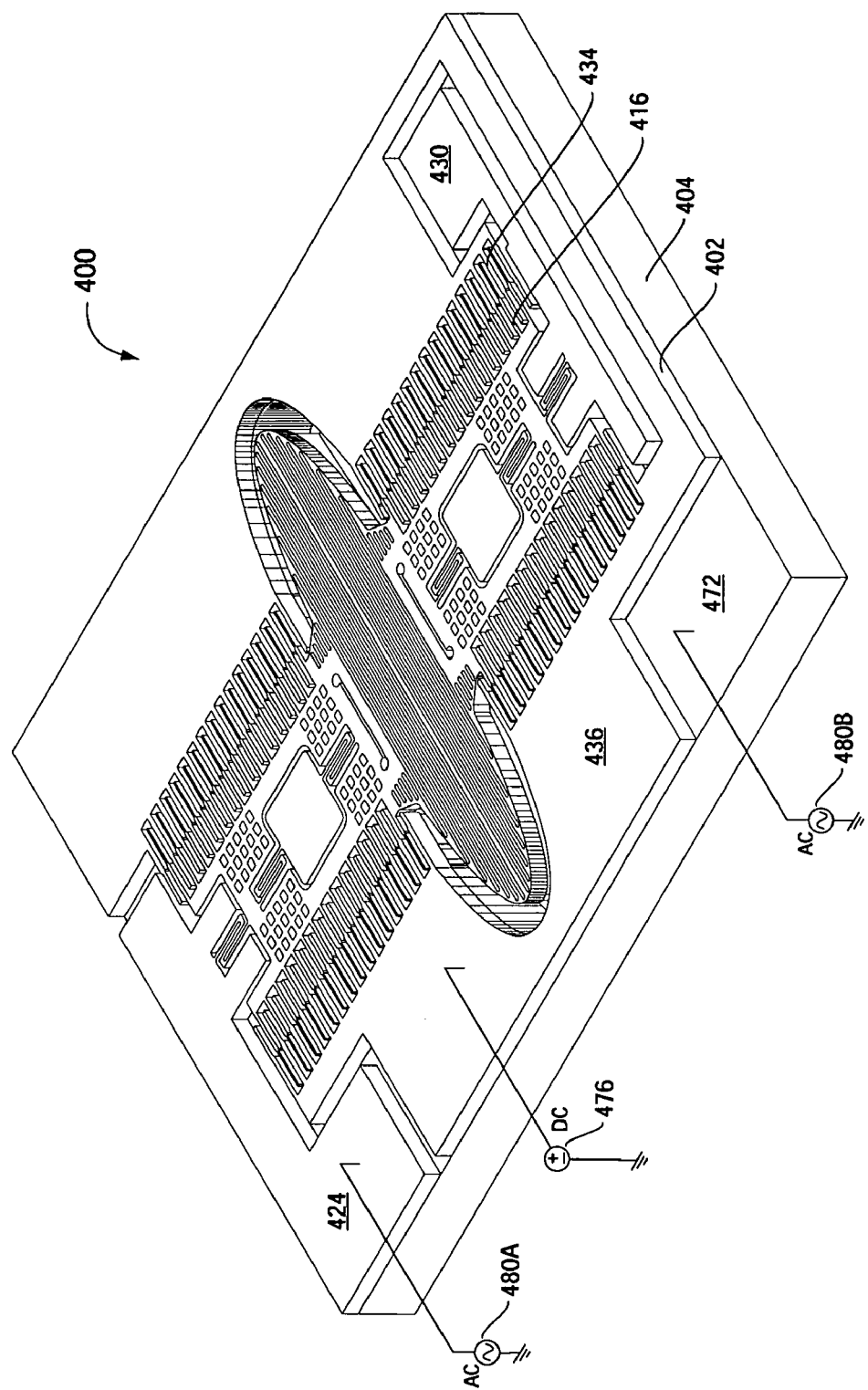

Referring to FIG. 1K, the operation of device 400 in another embodiment is explained hereafter. Rotational comb teeth 416 are coupled via bonding pad 424 to receive an oscillating voltage from AC voltage source 480A. Stationary comb teeth 434 are coupled via bonding pad 436 to receive a steady voltage from DC voltage source 476. Stationary comb teeth 474 (FIGS. 1D and 1E) are coupled via bonding pad 472 to receive an oscillating voltage from AC voltage source 480B. Between rotational comb teeth 416 and stationary comb teeth 434, a DC voltage difference changes the natural frequency and the rotation amplitude of device 400 while an AC voltage difference oscillates the mirror at the desired scanning frequency and at the desired scanning angle. Between rotational comb teeth 416 and stationary comb teeth 474 (FIGS. 1D and 1E), a DC voltage difference can also be used to change the amplitude of the rotational angle of device 400 while an oscillating voltage difference can also be used to oscillate the mirror at the desired scanning frequency and at the desired scanning angle. The capacitance between rotational comb teeth 416 and stationary comb teeth 474 can also be sensed through respective bonding pads 436 and 472 to determine the rotational angle of device 400.

FIGS. 3, 4, 5, 6, 7 and 8 illustrate a MEMS scanning mirror device 600 in one embodiment of the invention. Device 600 includes a top layer 602 (FIGS. 3 and 4) bonded atop but electrically insulated from a bottom layer 604 (FIGS. 6 and 7).

Figure 3:
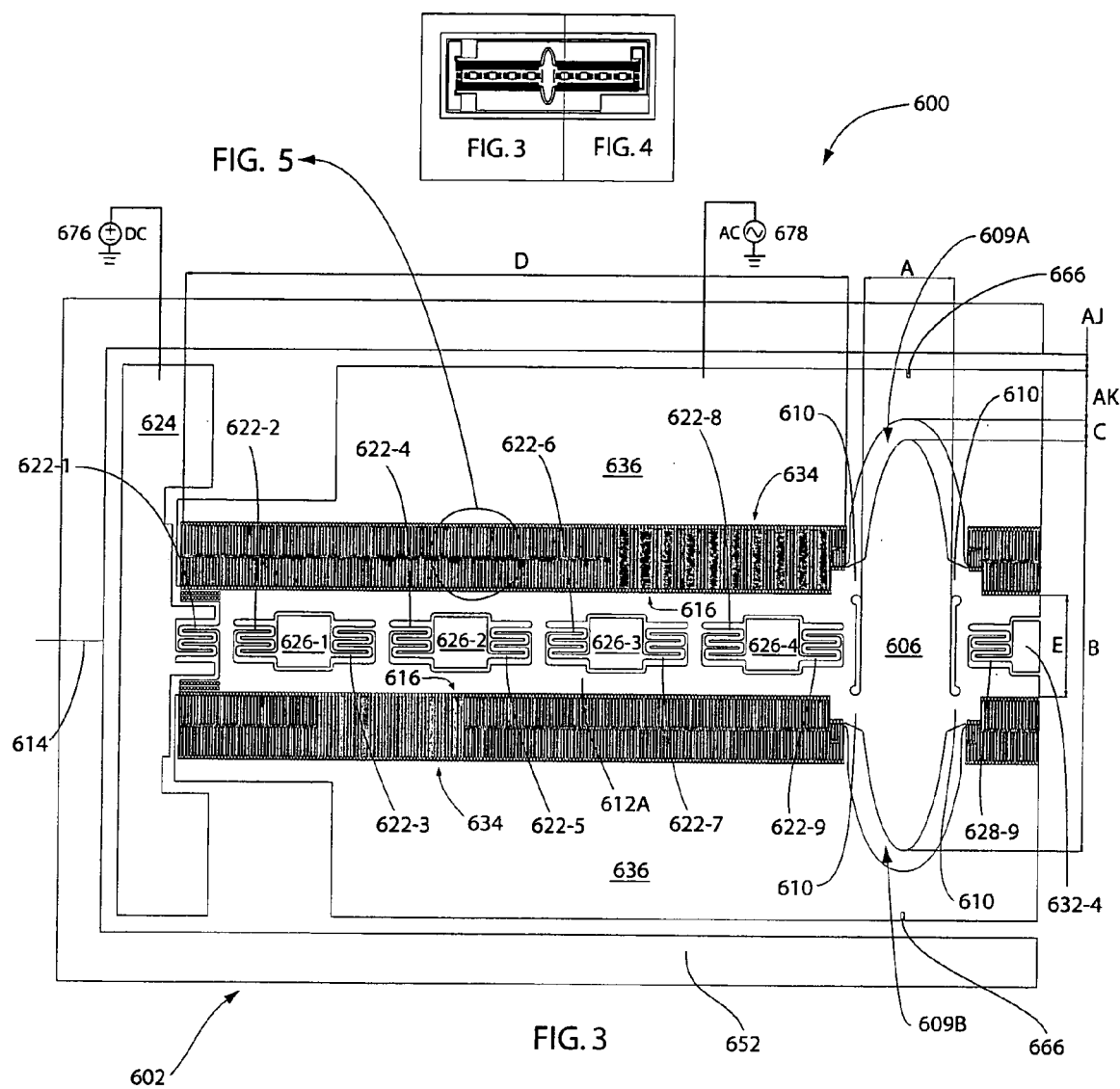

Referring to FIGS. 3 and 4, top layer 602 includes an oval mirror 606 with a width A and a length B. Mirror 606 is separated from the surrounding components (e.g., bonding pad 636) by gaps 609A and 609B having a width C. Width C of gaps 609A and 609B is designed to be greater than the widths of the gaps around more fragile components so that any trapped gas can escape around mirror 606 instead of the fragile components during the etching process. Alignment marks 666 are formed in bond pad 636 for aligning other components to device 600.

Opposing sides of mirror 606 are connected by multiple support attachments 610 to the proximate ends of beam-like structures 612A and 612B. By connecting mirror 606 at multiple locations to beams 612A and 612B, the dynamic deformation of mirror 606 is minimized. The position and the number of support attachments 610 can be further refined through finite element analysis. Each of beams 612A and 612B has a length D and a width E.

Figure 5:
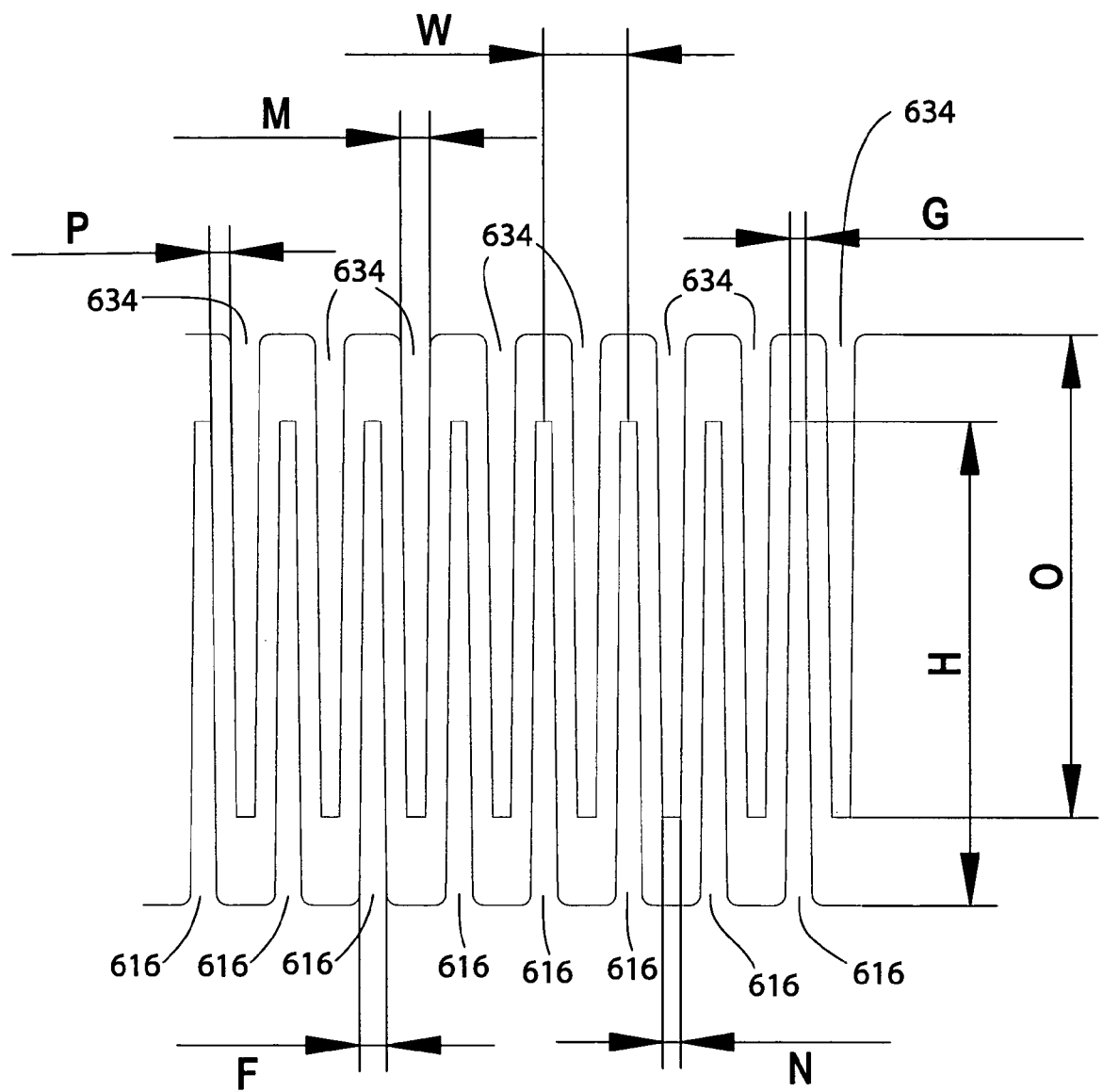

Opposing sides of beams 612A and 612B about a rotational axis 614 are connected to rotational comb teeth 616 (shown enlarged in FIG. 5). Rotational comb teeth 616 each has a tapered body consisting of a base width F, an end width (3, a length H, and a pitch W. By reducing the size and thus the weight of rotational comb teeth 616 at its ends, the inertia of the entire structure is reduced. By reducing the structural inertia, the scanning speed can be increased or/and the driving voltage can be reduced. In one embodiment, rotational comb teeth 616 provide the electrostatic biasing force used to increase the driving efficiency of the movable structure by tuning its modal frequency. In another embodiment, rotational comb teeth 616 provide the electrostatic driving force to drive the mirror. In yet another embodiment, rotational comb teeth 616 provide bath the electrostatic biasing force and the electrostatic driving force.

Beams 612A and 612B are connected by serpentine springs (also known as "hinges") to bonding pads mounted atop bottom layer 604. Specifically, beam 612A has a distal end connected by a serpentine spring 622-1 to a bonding pad 624. Furthermore, beam 612A has a midsection connected by (1) serpentine springs 622-2 and 622-3 to a bonding pad 626-1 formed within beam 612A, (2) serpentine springs 622-4 and 622-5 to a bonding pad 626-2 formed within beam 612A, (3) serpentine springs 622-6 and 622-7 to a bonding pad 626-3 formed within beam 612A, and (4) serpentine springs 622-8 and 622-9 to a bonding pad 626-4 formed within beam 612A.

Similarly, beam 612B has a distal end connected by a serpentine spring 628-1 to a bonding pad 630. Furthermore, beam 612B has a midsection connected by (1) serpentine springs 628-2 and 628-3 to a bonding pad 632-1 formed within beam 612B, (2) serpentine springs 628-4 and 628-5 to a bonding pad 632-2 formed within beam 612B, (3) serpentine springs 628-6 and 628-7 to a bonding pad 632-3 formed within beam 612B, and (4) serpentine springs 628-8 and 628-9 to a bonding pad 632-4 formed within beam 612B.

Thus, beams 612A and 612B are connected by springs in a distributed manner along rotational axis 614 of mirror 606. Each of serpentine springs 622 and 628 has a width I (FIG. 4) and consists of five sections having length J. Each of bonding pads 626 and 632 has a height K and width L.

By carefully adjusting the distribution of the stiffness and the location of the springs, all modal frequencies of the movable structure can be effectively separated and the desired rotational mode can be designed at the lowest resonance frequency. Since the main resonant frequency is the lowest and far apart from other structural modal frequencies, the mirror rotation will not excite any other undesired vibration mode. By using multiple springs, the maximum stress and strain on each spring are lower than conventional scanning mirror designs supported by only a pair of torsional beams. Since the stress and strain on each spring are reduced, the reliability of each spring is improved and the rotational angle is increased.

Top layer 602 further includes stationary comb teeth 634 (shown enlarged in FIG. 5) that are interdigitated in-plane with rotational comb teeth 616. Stationary comb teeth 634 each has a tapered body consisting of a base width M, an end width N, a length O, a constant spacing P with rotational comb teeth 634, and a pitch W. In one embodiment, stationary comb teeth 634 provide the electrostatic biasing force used to increase the driving efficiency of the movable structure by tuning its modal frequency. In another embodiment, stationary comb teeth 634 provide the electrostatic driving force to drive mirror 606. In yet another embodiment, stationary comb teeth 634 provide both the electrostatic biasing force and the electrostatic driving force. Stationary comb teeth 634 are connected to bond pad 636 mounted atop bottom layer 604.

A pad 652 is defined after top layer 602 is etched to form bonding pads 624 and 636. Pad 652 is separated by a distance AJ from bonding pads 624 and 636. Furthermore, bonding pad 636 has a width AK near gaps 609A and 609B.

Referring to FIGS. 6 and 7, bottom layer 604 includes a rib 660, which is bonded to the bottom surface of mirror 606. Rib 660 serves to stiffen mirror 606 without significantly increasing the mirror mass. Therefore, it minimizes the dynamic deformation of mirror 606. By minimizing the total dynamic deformation of mirror 606, the optical resolution of device 600 is improved. Rib 660 is separated from the components of bottom layer 604 by a gap 665. Rib 660 has an oval shape with horizontal crossbeams interconnected with vertical crossbeams. The shape of rib 660 can be further refined through finite element analysis.

Bottom layer 604 includes surfaces for anchoring the bonding pads in top layer 602. Specifically, (1) anchoring pads 668-1, 668-2, 668-3, 668-4 provide surfaces for mounting corresponding bonding pads 626-1, 626-2, 626-3, and 626-4 (FIG. 3), (2) anchoring pads 670-1, 670-2, 670-3, and 670-4 provide surfaces for mounting corresponding bonding pads 632-1, 632-2, 632-3, and 632-4 (FIG. 4), and (3) anchoring pad 672 provides a surface for mounting bonding pads 624, 630, 636, and 652 (FIGS. 3 and 4).

Bottom layer 604 includes opposing stationary comb teeth 674 and 675 (shown enlarged in FIG. 8) that are out-of-plane interdigitated with rotational comb teeth 616. In other words, they are interdigitated when viewed from above or when mirror 606 is rotated. Stationary comb teeth 674 each has a tapered body with a base width Q, an end width R, a length S, and a pitch W. The ends of stationary comb teeth 674 are located a distance X from a centerline 615, which coincides with rotational axis 614. Stationary comb teeth 675 each has a tapered body with a base width T, an end width U, a length V, and a pitch W. The ends of stationary comb teeth 675 are located a distance Y from centerline 615. A gap 682 is provided between stationary comb teeth 674 and 675 and anchoring pad 672. Gap 682 has a width greater than gaps between adjacent stationary comb teeth 474 so that gap 682 is etched deeper into bottom layer 604. A deeper gap 682 allows rotational comb teeth 616 to rotate at a greater angle without contacting bottom layer 604.

In one embodiment, the capacitances between rotational comb teeth 616 and stationary comb teeth 674 and 675 are sensed to determine the rotational position of the mirror. In one embodiment, stationary comb teeth 674 has greater surface area than stationary comb teeth 675 so that the capacitance generated when rotational comb teeth 616 rotates into stationary comb teeth 674 is larger than the capacitance generated when rotational comb teeth 616 rotates into stationary comb teeth 675. Thus, the direction of the mirror rotation can be detected.

Figure 9:
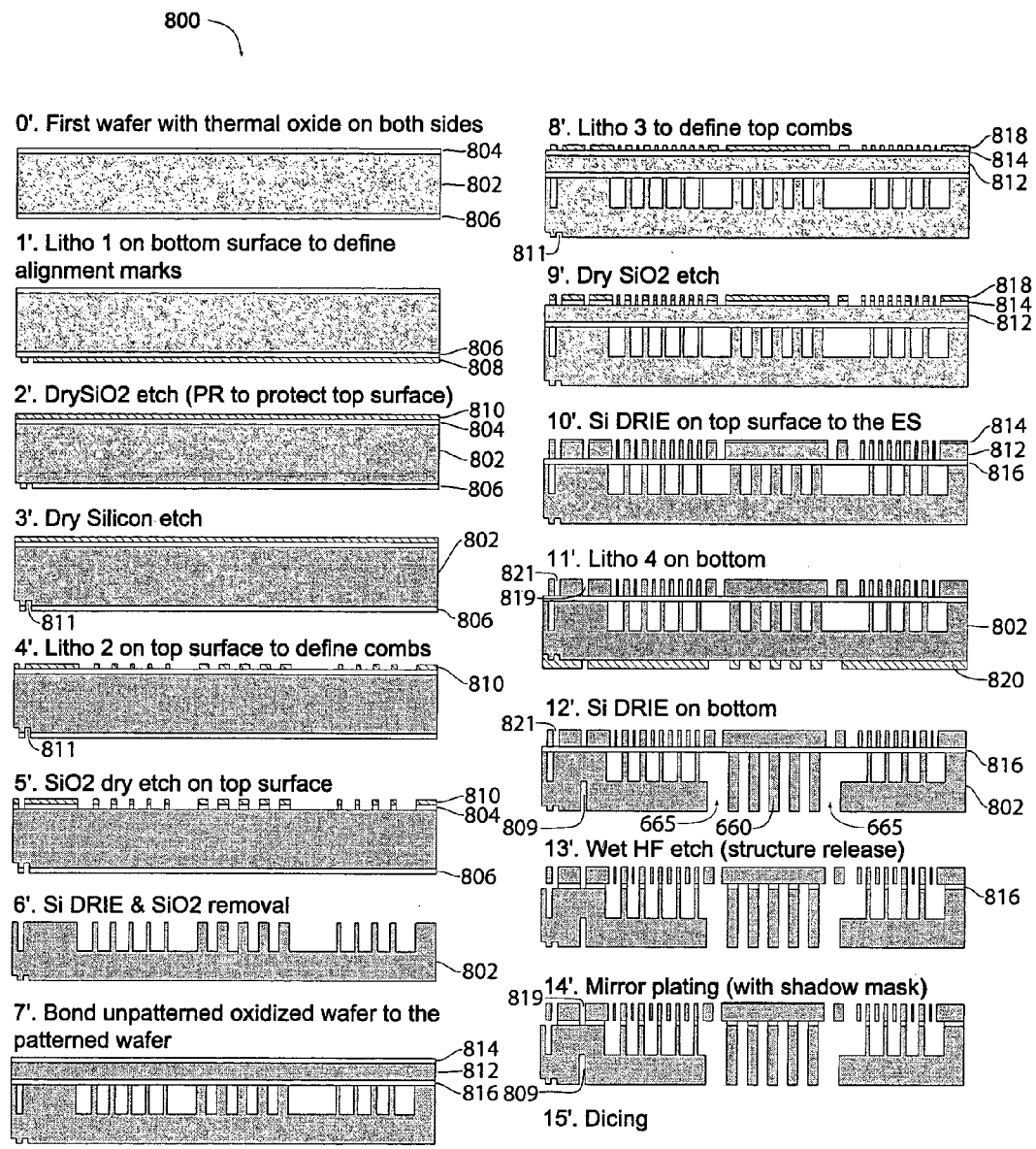
FIG. 9 illustrates process for manufacturing the device of FIGS. 3, 4, 5, 6, 7, and 8 in one embodiment of the invention.

FIG. 9 illustrates a method 800 for making device 600 in one embodiment of the invention. The process starts at a step 0' with a silicon wafer 802 having a silicon dioxide layer 804 formed on the top surface and a silicon dioxide layer 806 formed on the bottom surface. Wafer 802 is used to form bottom layer 604 (FIGS. 6 and 7) of device 600. Silicon wafer 802 has a thickness Z, silicon dioxide layer 804 has a thickness AA, and silicon dioxide layer 806 has a thickness AB.

In step 1', a photoresist 808 is deposited on oxide layer 806, exposed, and developed in a lithographic process to define one or more lithographic alignment marks 811 (shown in step 3').

In step 2', the bottom surface of wafer 802 is etched to remove portions of oxide layer 806 left unprotected by photoresist 808. In one embodiment, oxide layer 806 is dry etched. The top surface of wafer 802 is deposited with a photoresist 810 to protect it from the etching of the bottom surface.

In step 3', the bottom wafer surface of wafer 802 is etched to remove portions of wafer 802 left unprotected by oxide layer 806 to form lithography alignment marks 811. After the silicon dry etch, the remaining photoresists 808 and 810 are stripped.

In step 4', photoresist 810 is reapplied and is exposed and developed in a lithographic process to define rib 660 (FIG. 6), anchoring pads 668-1 to 668-4, 670-1 to 670-4, and 672 (FIGS. 6 and 7), and stationary comb teeth 674 and 675 (FIGS. 6, 7, and 8) on the top surface of wafer 802. The mask used is aligned with the lithographic alignment marks 811 on the bottom wafer surface.

In step 5', the top surface of wafer 802 is etched to remove portions of oxide layer 804 left unprotected by photoresist 810. In one embodiment, oxide layer 804 is dry etched.

Figure 8:
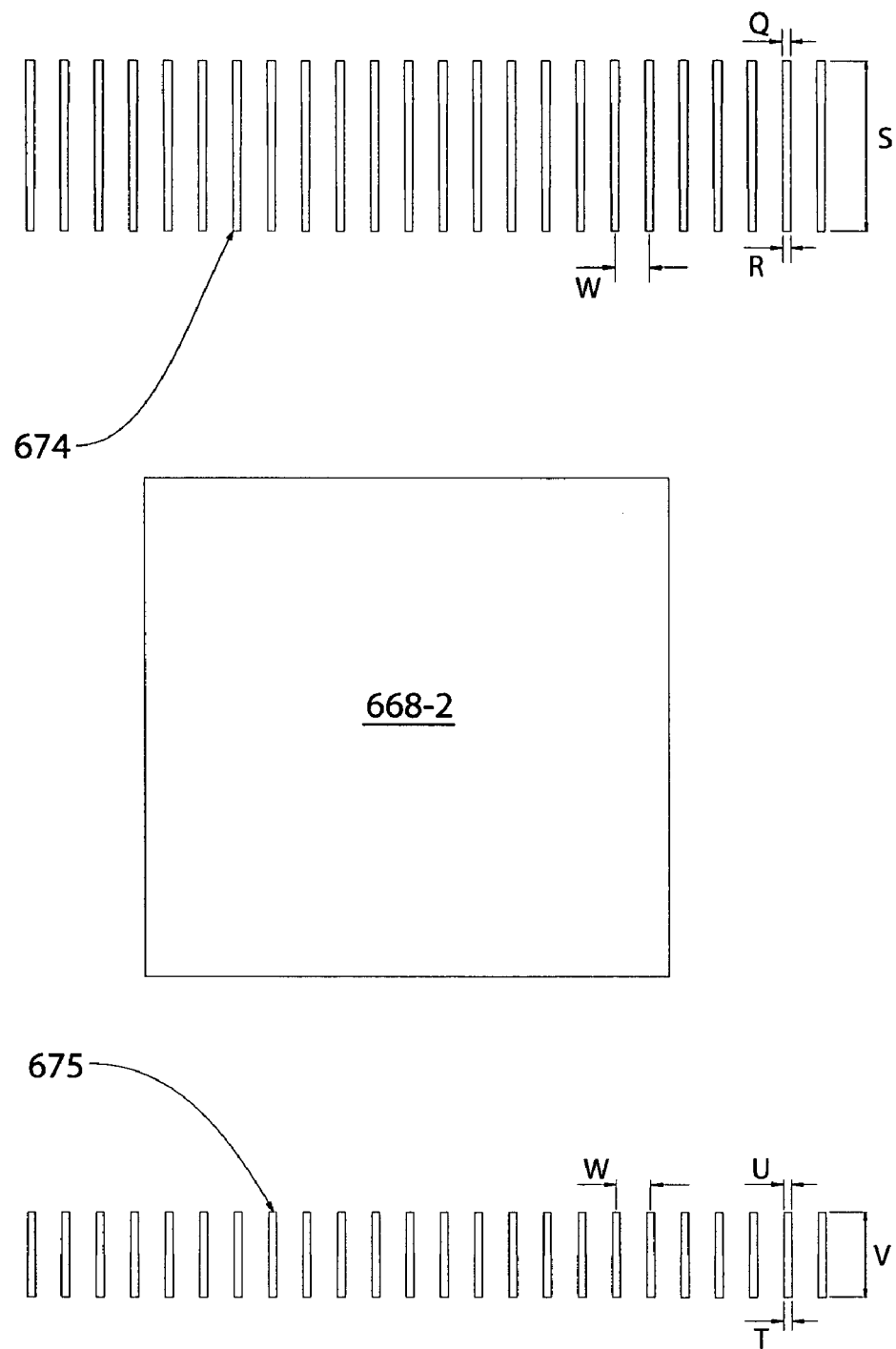

In step 6', the top surface of wafer 802 is etched to remove portions of wafer 802 left unprotected by oxide layer 804 to form rib 660 (FIG. 6), anchoring pads 668-1 to 668-4, 670-1 to 670-4, and 672 (FIGS. 6 and 7), and stationary comb teeth 674 and 675 (FIGS. 6, 7, and 8). Rib 660 is etched free from the other components while anchoring pads 668-1 to 668-4, 670-1 to 670-4, and 672 are etched to a height AC, and comb teeth 674 and 675 are etched to a height AD. Afterwards, the remaining photoresist 810 is stripped and oxide layers 804 and 806 are removed by a wet or dry etch.

In step 7', a silicon wafer 812 is bonded to the top surface of wafer 802. Wafer 812 has a silicon dioxide layer 814 formed on the top wafer surface and a silicon dioxide layer 816 formed on the bottom wafer surface. Wafer 812 is used to form top layer 602 (FIGS. 3 and 4) of device 600. Silicon wafer 812 has a thickness AE, silicon dioxide layer 814 has a thickness AF, and silicon dioxide layer 816 has a thickness AG. In one embodiment, wafers 812 and 802 are bonded by silicon fusion.

In step 8', a photoresist 818 is deposited on oxide layer 814, exposed, and developed in a lithographic process to define the components of top layer 602 (FIGS. 3, 4, and 5). The mask used is aligned with lithographic alignment marks 811 on the bottom wafer surface. Also defined in step 8' are one or more lithographic alignment marks 821 (shown in step 11') and a separation trench 819 (shown in step 11').

In step 9', the top surface of wafer 812 is etched to remove portions of oxide layer 814 left unprotected by photoresist 818. In one embodiment, oxide layer 814 is dry etched. Afterwards, the remaining photoresist 818 is stripped.

In step 10', the top surface of wafer 812 is etched to remove portions of wafer 812 left unprotected by oxide layer 814 to form the components of top layer 602 (FIGS. 3, 4, 5). In one embodiment, wafer 812 is etched using a DRIE process down to the etch stop formed by oxide layer 816. When the top of device 600 is etched through, gas trapped between the bonded wafers 802 and 812 may escape and damage fragile components such as the comb teeth and serpentine springs. To prevent such damage, gaps 609A and 609B (FIG. 3) around mirror 606 (FIG. 3) are designed to be larger than the gaps around the other components so that oxide layer 816 beneath gaps 609A and 609B are exposed before the other gaps. This allows the air to escape around mirror 606, which is a structurally strong component.

In step 11', a photoresist 820 is deposited on the bottom surface of wafer 802, exposed, and developed on the bottom surface of wafer 802 to define separation trench 809 (shown in step 12') and gap 665 (FIG. 6 and step 12') for separating rib 660 (FIG. 6) from bottom layer 604 (FIG. 6). The mask used is aligned with lithographic alignment marks 821 on the top wafer surface.

In step 12', the bottom surface of wafer 802 is etched to remove portions of wafer 802 left unprotected by photoresist 820 to form separation trench 809 and to separate rib 660 (FIG. 6) from bottom layer 604 (FIG. 6). Separation trench 809 has a depth of AH. In one embodiment, wafer 802 is etched using a DRIE process.

In step 13', portions of oxide layer 816 are removed from the structure to release the various components of device 600 while maintaining the bonds between the corresponding bonding and anchoring pads, and between the mirror and the rib. In one embodiment, portions of oxide layer 816 are removed using a hydrofluoric acid wet etch.

In step 14', the top surface of mirror 606 (FIG. 3) is deposited with a reflective material (e.g., aluminum) to create a mirror surface. In one embodiment, a shadow mask is used to define areas to be deposited with the reflective material.

In step 15', devices 600 made from wafers 802 and 812 are singulated. In one embodiment, wafers 802 and 812 are singulated by dicing through separation trenches 809 and 819 (shown in step 14').

In one embodiment of the invention, the dimensions of device 600 are as follows:

| Reference number | Dimension (in microns) |
| --- | --- |
| Width A of mirror 606 | >1000 & <1200 (e.g., 1110) |
| Length B of mirror 606 | >4000 & <5500 (e.g., 5000) |
| Width C of mirror gap 609 | >150 & <350 (e.g., (250) |
| Length D of beam 612 | >3000 & <9000 (e.g., 8000) |
| Width E of beam 612 | >800 & <1400 (e.g., 1240) |
| Base width F of rotational comb teeth 616 | >8 & <14 (e.g., 10.5) |
| End width G of rotational comb teeth 616 | >4 & <10 (e.g., 6) |
| Length H of rotational comb teeth 616 | >400 & <900 (e.g., 780) |
| Width I of spring 622 | >20 & <60 (e.g., 50) |
| Length J of spring 622 | >200 & <500 (e.g., 390) |
| Height K of bonding pads 626 and 632 | >350 & <700 (e.g., 640) |
| Width L of bonding pads 626 and 632 | >350 & <700 (e.g., 660) |
| Base width M of stationary comb teeth 634 | >8 & <14 (e.g., 11.5) |
| End width N of stationary comb teeth 634 | >4 & <10 (e.g., 7) |
| Length O of stationary comb teeth 634 | >400 & <900 (e.g., 780) |
| Spacing P between rotational comb teeth 616 and stationary comb teeth 636 | >8 & 14 (e.g., 11.5) |
| Base width Q of stationary comb teeth 674 | >8 & <14 (e.g., 8) |
| End width R of stationary comb teeth 674 | >4 & <10 (e.g., 7) |
| Length S of stationary comb teeth 674 | >150 & <500 (e.g., 200) |
| Base width T of stationary comb teeth 675 | >6 & <14 (e.g., 7.5) |
| End width U of stationary comb teeth 675 | >4 & <10 (e.g., 7) |
| Length V of stationary comb teeth 675 | >150 & <500 (e.g., 100) |
| Comb teeth pitch W | >30 & <50 (e.g., 40) |
| Distance X from stationary comb teeth 674 to centerline 615 | >500 & <700 (e.g., 660) |
| Distance Y from stationary comb teeth 675 to centerline 615 | >500 & <700 (e.g., 660) |
| Thickness Z of bottom wafer 802 used to form bottom layer 604 | >450 & <550 (e.g., 525) |
| Thickness AA of top oxide layer 804 on bottom wafer 802 | >1 & <2 (e.g., 1.5) |
| Thickness AB of bottom oxide layer 806 on bottom wafer 802 | >1 & <2 (e.g., 1.5) |
| Height AC of anchoring pads 668 and 670 on bottom layer 604 | >300 & <450 (e.g., 400) |
| Height AD of stationary comb teeth 674 and 675 on bottom layer 604 | >250 & <450 (e.g., 300) |
| Thickness AE of top wafer 812 used to form top layer 602 | >120 & <240 (e.g., 150) |
| Thickness AF of top oxide layer 814 on top wafer 812 | >1 & <2 (e.g., 1.2) |
| Thickness AG of bottom oxide layer 816 on top wafer 812 | >1 & <2 (e.g., 1.2) |
| Depth AH of separation trench 809 on bottom wafer 812 | >120 & <240 (e.g., 180) |
| Minimum distance AJ from pad 152 to any of pads 624 and 636 | >120 & <240 (e.g., 200) |
| Distance AK from pad 652 to gap 609 around the mirror | >400 (e.g., 250) |
| Number of springs | 2 to 20 (e.g., 18) |
| Number of bonding pads connected to springs | 2 to 10 (e.g., 10) |
| Total mirror thickness with rib | >240 (e.g., 675) |
| Total hinge length for one spring | >600 (e.g., 1900) |

The operation of device 600 in one embodiment is explained hereafter. Rotational comb teeth 616 are coupled via bonding pad 624 to receive a bias voltage (e.g., ground or a DC voltage) from a voltage source 676. This is used to change the natural frequency of device 600. Stationary comb teeth 634 are coupled via bonding pad 636 to receive a driving voltage (e.g., an AC voltage with or without a zero-offset) from a voltage source 678. This is used to oscillate mirror 606 at the desired scanning frequency and at the desired scanning angle. Stationary comb teeth 674 and 675 are coupled via bonding pad 672 to a capacitance meter 680. This is used to detect the angle of rotation of mirror 606.

Figure 10:
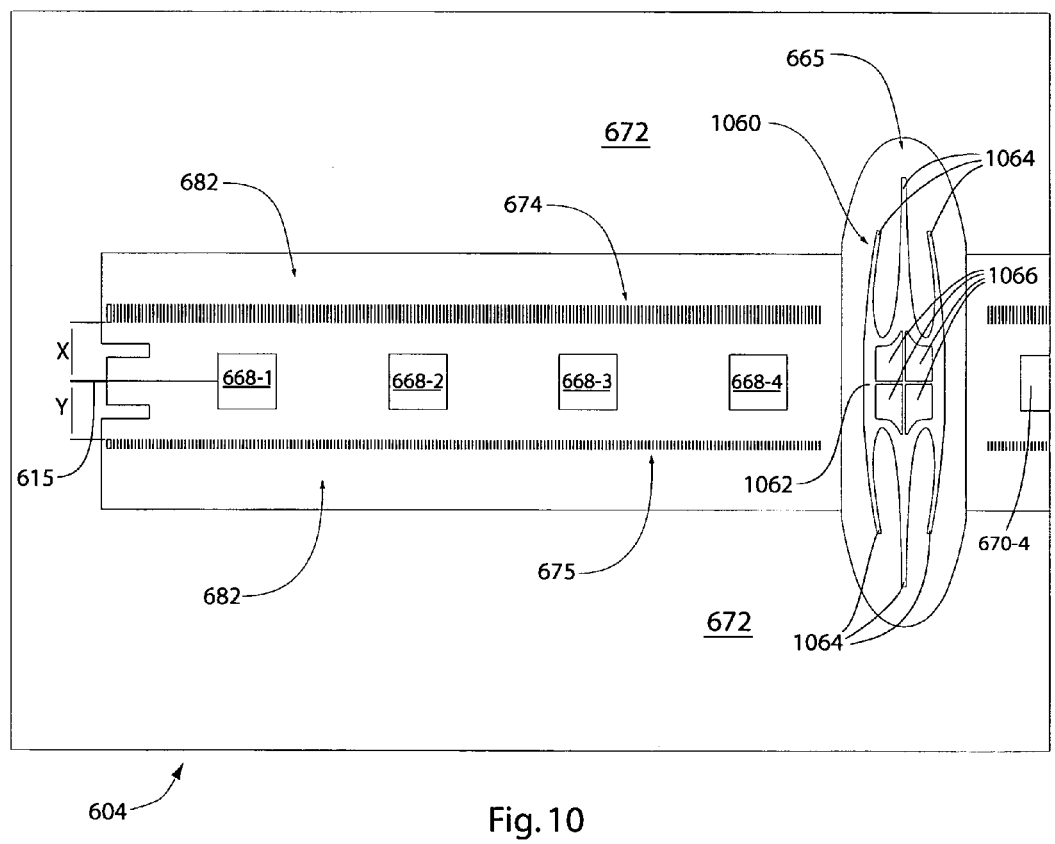
FIG. 10 illustrates another rib structure for supporting the mirror of a MEMS device in another embodiment of the invention.

FIG. 10 illustrates another rib 1060 that can be used to stiffen mirror 606 without significantly increasing the mirror mass in one embodiment of the invention. Rib 1060 includes a midsection 1062 having three protruding beams 1064 on either side of midline 615. Midsection 1062 also includes holes 1066 that reduces the mass of rib 1060. The shape of rib 1060 can be further refined through finite element analysis.

Various other adaptations and combinations of features of the embodiments disclosed are within the scope of the invention. For example, devices 400 and 600 can be used in laser printing, barcode scanning, and micro-display applications. Numerous embodiments are encompassed by the following claims.

What is claimed is:

1. A micro-electro-mechanical system (MEMS) mirror device, comprising:
a mirror comprising a length greater than 4000 and less than 5500 microns, and a thickness greater than 240 microns;
beams connected to the mirror, wherein each beam extends from a respective proximal end at the mirror to a respective distal end spaced from the mirror, and each beam comprises a plurality of respective rotational comb teeth;
bonding pads; and
springs connected between the beams and the bonding pads, wherein each beam is connected by multiple springs along a rotational axis of the mirror to respective bonding pads, and at least one spring is located between another spring and the mirror.

2. The device of claim 1, wherein each beam comprises a width greater than 800 and less than 1400 microns, a length greater than 3000 and less than 9000 microns, and a thickness greater than 120 and less than 240 microns.

3. The device of claim 1, wherein each rotational comb tooth comprises a base width greater than 8 and less than 14 microns, an end width greater than 4 and less than 10 microns, a length greater than 400 and less than 900 microns, a thickness greater than 120 and less than 240 microns, and a pitch greater than 30 and less than 50 microns.

4. The device of claim 1, wherein each spring comprises a width greater than 20 and less than 60 microns, a total length greater than 600 microns, and a thickness greater than 120 and less than 240 microns.

5. The device of claim 1, wherein the mirror includes a rib having horizontal crossbeams interconnected with vertical crossbeams, each crossbeam having a thickness greater than 450 and less than 550 microns.

6. The device of claim 1, further comprising a first plurality of stationary comb teeth, wherein the first plurality of stationary comb teeth and the plurality of rotational comb teeth are interdigitated in-plane.

7. The device of claim 6, wherein a space between each of the plurality of rotational comb teeth and each of the first plurality of stationary comb teeth is greater than 8 and less than 14 microns.

8. The device of claim 6, wherein each of the first plurality of stationary comb teeth comprises a base width greater than 8 and less than 14 microns, an end width greater than 4 and less than 10 microns, a length greater than 400 and less than 900 microns, a thickness greater than 120 and less than 240 microns, and a pitch greater than 30 and less than 50 microns.

9. The device of claim 6, wherein the plurality of rotational comb teeth is coupled to a first steady or oscillating voltage and the plurality of stationary comb teeth is coupled to a second steady or oscillating voltage.

10. The device of claim 6, further comprising a second plurality of stationary comb teeth and a third plurality of stationary comb teeth, wherein the second and the third pluralities of stationary comb teeth are out-of-plane interdigitated with the plurality of rotational comb teeth.

11. The device of claim 10, wherein each of the second plurality of stationary comb teeth comprises a base width greater than 8 and less than 14 microns, an end width greater than 4 and less than 10 microns, a length greater than 150 and less than 500 microns, a height greater than 250 and less than 450 microns, and a pitch greater than 30 and less than 50 microns.

12. The device of claim 11, wherein each of the third plurality of stationary comb teeth comprises a base width greater than 6 and less than 14 microns, an end width greater than 4 and less than 10 microns, a length greater than 150 and less than 500 microns, a height greater than 250 and less than 450 microns, and a pitch greater than 30 and less than 50 microns.

13. The device of claim 12, wherein ends of the second plurality of stationary comb teeth are located greater than 500 and less than 700 microns from the rotational axis, and ends of the third plurality of stationary comb teeth are located greater than 500 and less than 700 microns from the rotational axis.

14. The device of claim 10, wherein the second and the third pluralities of stationary comb teeth are coupled to a capacitance meter to sense a rotational angle of the mirror.

15. The device of claim 1, wherein a gap surrounding the mirror has a width greater than 150 and less than 350 microns.

16. The device of claim 15, further comprising an additional bonding pad around the mirror, wherein the additional bonding pad has a narrowest width greater than 400 microns about the gap surrounding the mirror.

17. The device of claim 1, comprising at least two beams, ten springs, and six bonding pads.

18. The device of claim 1, wherein the devices is used in an application selected from the group consisting of laser printing, barcode scanning, and micro-display applications.

19. The device of claim 1, wherein the mirror includes a rib comprising a midsection and beams protruding from opposing sides of the midsection, the rib having a thickness greater than 450 and less than 550 microns.

20. The device of claim 1, wherein the mirror comprises a width greater than 1000 and less than 1200 microns.

21. A micro-electro-mechanical system (MEMS) mirror device, comprising:
   a bottom layer, comprising:
      a rib;
      a first plurality of stationary comb teeth;
      a second plurality of stationary comb teeth;
      anchoring pads;
   a top layer, comprising:
      a mirror having a bottom surface bonded to the rib, the mirror comprising a length greater than 4000 and less than 5500 microns, and a thickness greater than 120 microns;
      beams connected to the mirror, wherein each beam extends from a respective proximal end at the mirror to a respective distal end spaced from the mirror, and each beam comprises a plurality of rotational comb teeth;
      bonding pads being bonded atop but electrically insulated from respective anchoring pads;
      springs connected between the beams and the bonding pads, wherein each beam is connected by multiple springs along a rotational axis of the mirror to respective bonding pads, and at least one spring is located between another spring and the mirror;
      a third plurality of stationary comb teeth connected to an additional bonding pad bonded atop but electrically insulated from one of the anchoring pads;
      wherein the first and the second pluralities of stationary comb teeth are out-of-plane interdigitated with the rotational comb teeth, and the third plurality of stationary comb teeth are in-plane interdigitated with the plurality of rotational comb teeth.

22. The device of claim 21, wherein each beam comprises a width greater than 800 and less than 1400 microns, a length greater than 3000 and less than 9000 microns, and a thickness greater than 120 and less than 240 microns.

23. The device of claim 21, wherein each rotational comb tooth comprises a base width greater than 8 and less than 14 microns, an end width greater than 4 and less than 10 microns, a length greater than 400 and less than 900 microns, a thickness greater than 120 and less than 240 microns, and a pitch greater than 30 and less than 50.

24. The device of claim 21, wherein each spring comprises a width greater than 20 and less than 60 microns, a total length greater than 600 microns, and a thickness greater than 120 and less than 240 microns.

25. The device of claim 21, wherein the rib comprises crossbeams each having a thickness greater than 450 and less than 550 microns.

26. The device of claim 21, wherein each of the first plurality of stationary comb teeth comprises a base width grater than 8 and less than 14 microns, an end width greater than 4 and less than 10 microns, a length greater than 150 and less than 500 microns, a height greater than 250 and less than 450 microns, and a pitch greater than 30 and less than 50 microns.

27. The device of claim 26, wherein each of the second plurality of stationary comb teeth comprises a base width greater than 6 and less than 14 microns, an end width greater than 4 and less than 10 microns, a length greater than 150 and less than 500 microns, a height greater than 250 and less than 450 microns, and a pitch greater than 30 and less than 50 microns.

28. The device of claim 27, wherein ends of the first plurality of stationary comb teeth are located greater than 500 and less than 700 microns from the rotational axis, and ends of the second plurality of stationary comb teeth are located greater than 500 and less than 700 microns from the rotational axis.

29. The device of claim 27, wherein each of the third plurality of stationary comb teeth comprises a base width greater than 8 and less than 14 microns, an end width greater than 4 and less than 10 microns, a length greater than 400 and less than 900 microns, a thickness greater than 120 and less than 240 microns, and a pitch greater than 30 and less than 50 microns.

30. The device of claim 21, wherein the plurality of rotational comb teeth is coupled to a first steady or oscillating voltage and the third plurality of stationary comb teeth is coupled to a second steady or oscillating voltage.

31. The device of claim 30, wherein the first and the second pluralities of stationary comb teeth are coupled to a capacitance meter to sense a rotational angle of the mirror.

32. The device of claim 21, wherein a gap surrounding the mirror has a width greater than 150 and less than 350 microns.

33. The device of claim 32, wherein the additional bonding pad connected to the third plurality of stationary comb teeth has a narrowest width greater than 400 microns about the gap surrounding the mirror.

34. The device of claim 21, comprising at least two beams, ten springs, six bonding pads, and five anchoring pads.

35. The device of claim 21, wherein a space between each of the plurality of rotational comb teeth and each of the third plurality of stationary comb teeth is greater than 8 and less than 14 microns.

36. The device of claim 21, wherein the device is used in an application selected from the group consisting of laser printing, barcode scanning, and micro-display applications.

37. The device of claim 21, wherein the rib comprises horizontal crossbeams interconnected with vertical crossbeams, each crossbeam having a thickness greater than 450 and less than 550 microns.

38. The device of claim 21, wherein the rib comprising a midsection and beams protruding from opposing sides of the midsection, the rib having a thickness greater than 450 and less than 550 microns.

39. The device of claim 21, wherein the mirror comprises a width greater than 1000 and less than 1200 microns.

40. A micro-electro-mechanical system (MEMS) mirror device, comprising:
   a mirror comprising a length greater than 4000 and less than 5500 microns, and a thickness greater than 240 microns:
   beams connected to the mirror, each beam comprising a plurality of rotational comb teeth;
   bonding pads; and
   springs, wherein each beam is connected by multiple springs to respective bonding pads and some of the bonding pads are defined within the beams and connected to at least one spring.

41. The device of claim 40, wherein said some of the bonding pads each has a width and a height greater than 350 and less than 700 microns, and a thickness greater than 120 and less than 240 microns.

42. A micro-electro-mechanical system (MEMS) mirror device, comprising:
   a bottom layer, comprising:
      a rib;
      a first plurality of stationary comb teeth;
      a second plurality of stationary comb teeth;
      anchoring pads;
   a top layer, comprising:
      a mirror having a bottom surface bonded to the rib, the mirror comprising a length greater than 4000 and less than 5500 microns, and a thickness greater than 120 microns;
      beams connected to the mirror, each beam comprising a plurality of rotational comb teeth;
      bonding pads being bonded atop but electrically insulated from respective anchoring pads;
      springs, wherein each beam is connected by the springs to respective bonding pads and some of the bonding pads are defined within the beams and connected to at least one spring;
      a third plurality of stationary comb teeth connected to an additional bonding pad bonded atop but electrically insulated from one of the anchoring pads;
      wherein the first and the second pluralities of stationary comb teeth are out-of-plane interdigitated with the rotational comb teeth, and the third plurality of stationary comb teeth are in-plane interdigitated with the plurality of rotational comb teeth.

43. The device of claim 42, wherein said some of the bonding pads each has a width and a height greater than 350 and less than 700 microns, and a thickness greater than 120 and less than 240 microns.

* * * * *